US 6,576,539 B1

(12) United States Patent
Lin

(10) Patent No.: US 6,576,539 B1
(45) Date of Patent: *Jun. 10, 2003

(54) SEMICONDUCTOR CHIP ASSEMBLY WITH INTERLOCKED CONDUCTIVE TRACE

(76) Inventor: Charles W.C. Lin, 34 Pinewood Grove, Singapore 738290 (SG)

(*) Notice: Subject to any disclaimer, the term of this patent is extended or adjusted under 35 U.S.C. 154(b) by 0 days.

This patent is subject to a terminal disclaimer.

(21) Appl. No.: 09/939,140

(22) Filed: Aug. 24, 2001

Related U.S. Application Data

(63) Continuation-in-part of application No. 09/878,626, filed on Jun. 11, 2001, which is a continuation-in-part of application No. 09/687,619, filed on Oct. 13, 2000.

(51) Int. Cl.[7] .............................................. H01L 21/44
(52) U.S. Cl. ...................... 438/611; 438/641; 438/691; 438/110; 438/111; 438/112; 438/113
(58) Field of Search ....................... 156/324.4; 438/100, 438/111, 112, 113, 115, 123, 641, 611, 691

(56) References Cited

U.S. PATENT DOCUMENTS

| 4,442,967 A | 4/1984 | van de Pas et al. ........ 228/159 |
| 4,661,192 A | 4/1987 | McShane .................... 156/292 |
| 4,717,066 A | 1/1988 | Goldenberg et al. ........ 228/179 |
| 4,750,666 A | 6/1988 | Neugebauer et al. ....... 228/160 |
| 4,807,021 A | 2/1989 | Okumura ..................... 357/75 |
| 4,925,083 A | 5/1990 | Farassat et al. ............. 228/102 |
| 4,937,653 A | 6/1990 | Blonder et al. ................ 357/68 |
| 4,955,523 A | 9/1990 | Carlomagno et al. ....... 228/179 |
| 4,970,571 A | 11/1990 | Yamakawa et al. ........... 357/71 |
| 4,984,358 A | 1/1991 | Nelson ......................... 29/830 |
| 5,014,111 A | 5/1991 | Tsuda et al. ................... 357/68 |
| 5,060,843 A | 10/1991 | Yasuzato et al. ............. 228/179 |
| 5,074,947 A | 12/1991 | Estes et al. ............... 156/307.3 |
| 5,090,119 A | 2/1992 | Tsuda et al. ................... 29/843 |
| 5,106,461 A | 4/1992 | Volfson et al. .............. 205/125 |
| 5,116,463 A | 5/1992 | Lin et al. ..................... 156/653 |

(List continued on next page.)

FOREIGN PATENT DOCUMENTS

| EP | 0 718 882 A1 | 6/1996 | ......... H01L/23/057 |
| WO | WO 97/38563 | 10/1997 | ............ H05K/1/03 |
| WO | WO 99/57762 | 11/1999 | ........... H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

(List continued on next page.)

Primary Examiner—David Nelms
Assistant Examiner—Reneé R Berry
(74) Attorney, Agent, or Firm—David M. Sigmond

(57) ABSTRACT

A semiconductor chip assembly includes a semiconductor chip, a conductive trace, a connection joint, an insulative adhesive and an encapsulant. The conductive trace includes a routing line and a pillar. The routing line extends within and outside a periphery of the chip, and the pillar is disposed outside the periphery of the chip and extends away from the chip. The connection joint contacts and electrically connects the routing line and the pad. The adhesive is sandwiched between the routing line and the chip and contacts a surface of the routing line that faces away from the chip, thereby interlocking the routing line to the assembly. The encapsulant extends into a channel in the pillar, thereby interlocking the pillar to the assembly.

120 Claims, 41 Drawing Sheets

U.S. PATENT DOCUMENTS

| | | | |
|---|---|---|---|
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 437/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 437/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,949,655 A | 9/1999 | Glenn | 361/783 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,045,655 A * | 4/2000 | DiStefano et al. | 156/324.4 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,143,588 A | 11/2000 | Glenn | 438/116 |
| 6,159,770 A | 12/2000 | Tetaka et al. | 438/112 |
| 6,274,927 B1 | 8/2001 | Glenn | 257/680 |

OTHER PUBLICATIONS

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Solder Via".

U.S. application Ser. No. 09/464,562, filed Dec. 16, 1999, entitled "Bumpless Flip Chip Assembly With Strips and Via–Fill".

U.S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making A Semiconductor Chip Assembly".

U.S. application Ser. No. 09/665,928, filed Sep. 20, 2000, entitled "Semiconductor Chip Assembly With Ball Bond Connection Joint".

U.S. application Ser. No. 09/655,931, filed Sep. 20, 2000, entitled "Method Of Making A Support Circuit With A Tapered Through–Hole For A Semiconductor Chip Assembly".

U.S. application Ser. No. 09/677,207, filed Oct. 2, 2000, entitled "Method Of Making A Semiconductor Chip Assembly With A Conductive Trace Subtractively Formed Before And After Chip Attachment".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Termical and Connection Joint".

U.S. application Ser. No. 09/864,773, filed May 24, 2001, entitled "Semiconductor Chip Assembly With Ball Bond Connection Joint".

\* cited by examiner

SEMICONDUCTOR CHIP ASSEMBLY WITH INTERLOCKED CONDUCTIVE TRACE

CROSS-REFERENCE TO RELATED APPLICATIONS

This application is a continuation-in-part of U.S. application Ser. No. 09/878,626 filed Jun. 11, 2001, which is a continuation-in-part of U.S. application Ser. No. 09/687,619 filed Oct. 13, 2000, each of which is incorporated by reference.

BACKGROUND OF THE INVENTION

1. Field of the Invention

The present invention relates to a semiconductor chip assembly, and more particularly to a method of mechanically and electrically connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

Conductive adhesives that electrically connect pads on chips to conductive traces on support circuits are well-known in the art. As mentioned above, organic conductive adhesive bumps with conductive fillers in polymer binders have been used, but they do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a conductive trace that provides a low cost, high performance, high reliability package.

Another objective of the present invention is to provide a convenient, cost-effective method for manufacturing semiconductor chip assemblies as chip scale packages, chip size packages, ball grid arrays or other structures.

In accordance with one aspect of the invention, a semiconductor chip assembly includes a semiconductor chip, a conductive trace, a connection joint, and an insulative adhesive. The conductive trace includes a routing line and a pillar. The connection joint contacts and electrically connects the routing line and the pad.

In one embodiment, the adhesive is sandwiched between the routing line and the chip and contacts a surface of the routing line that faces away from the chip, thereby interlocking the routing line to the assembly.

In another embodiment, the pillar extends outside a periphery of the chip, and an encapsulant extends into a channel in the pillar, thereby interlocking the pillar to the assembly.

In accordance with another aspect of the invention, a method of making a semiconductor chip assembly includes attaching a chip to a metallic structure using an insulative adhesive, wherein the chip includes a conductive pad, and the metallic structure includes a metal base, a first metal pattern and a second metal pattern, the first metal pattern is disposed on a side of the metal base that faces away from the chip, and the second metal pattern is disposed on a side of the metal base that faces towards the chip, then etching the metal base, thereby exposing the second metal pattern, and then forming a connection joint that contacts and electrically connects the second metal pattern and the pad.

The method may include electroplating the first and second metal patterns on the metal base before attaching the chip to the metallic structure, and etching the adhesive thereby exposing the pad after etching the metal base and before forming the connection joint.

The method may also include etching the metal base by applying a wet chemical etch using the first metal pattern as an etch mask to remove all of the metal base above the pad without removing a portion of the metal base outside the pad such that the remaining portion of the metal base provides the pillar and the second metal pattern provides the routing line, and then removing the first metal pattern.

The method may also include etching the metal base using the second metal pattern as an etch mask, thereby forming an undercut channel in the metal base that exposes a portion of the second metal pattern that faces away from the chip and towards the metal base, and then filling the adhesive into the undercut channel, thereby enhancing the mechanical attachment between the second metal pattern and the adhesive.

The method may also include etching the metal base using the second metal pattern as an etch mask after attaching the chip to the metallic structure using the adhesive, thereby forming an undercut channel in the metal base that exposes a portion of the second metal pattern that faces away from the chip and towards the metal base, and then filling the encapsulant into the undercut channel, thereby enhancing the mechanical attachment between the second metal pattern and the encapsulant.

An advantage of the present invention is that the semiconductor chip assembly need not include wire bonds, TAB leads or solder joints. Another advantage is that the conductive trace can be interlocked by the adhesive and/or encapsulant. Another advantage is that the pillar can be formed using etching (i.e., subtractively) rather than by electroplating or electroless plating (i.e., additively) which improves uniformity and reduces manufacturing time and cost. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 4A:
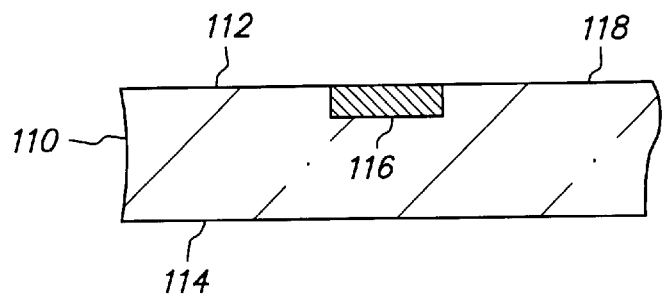
FIGS. 4A–4N are enlarged cross-sectional views corresponding to FIGS. 1A–1N, respectively.
Figure 4B:
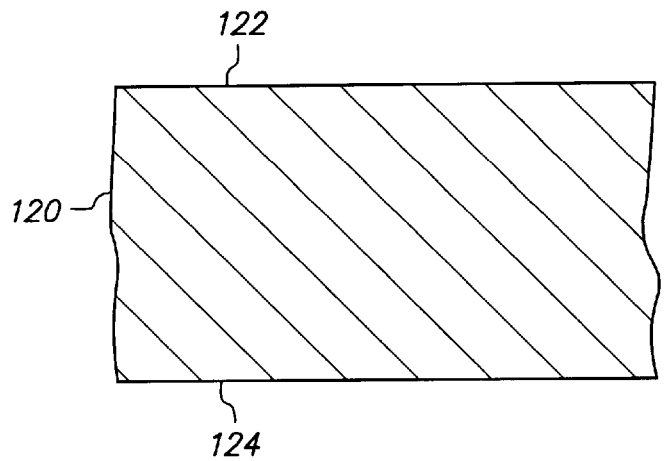
Figure 4C:
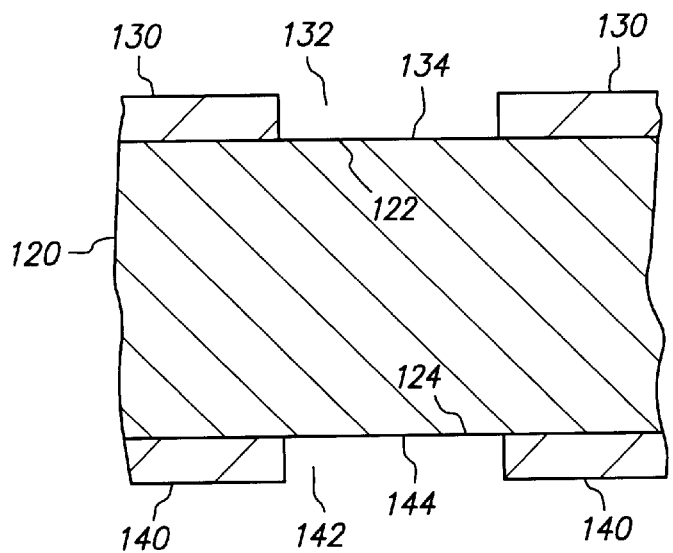
Figure 4D:
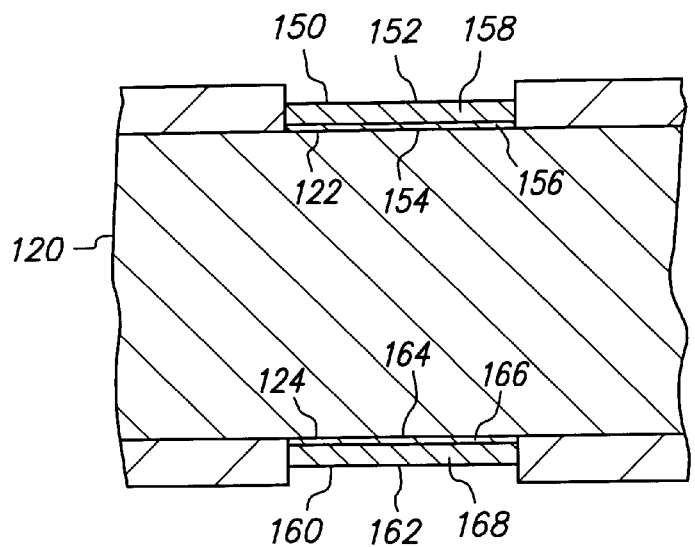
Figure 4E:
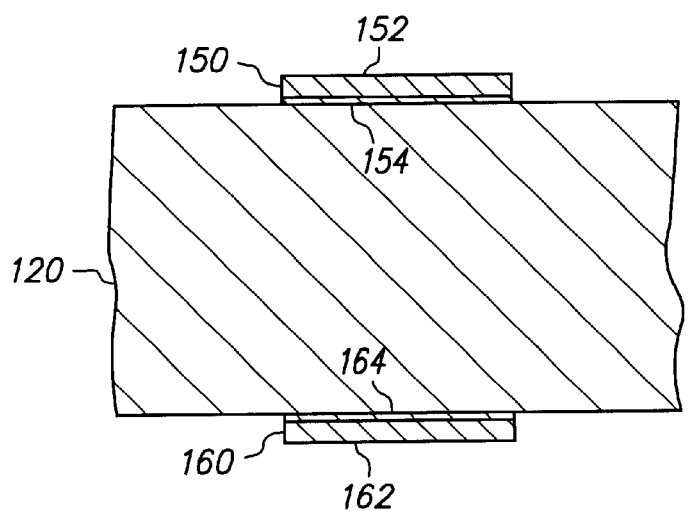
Figure 4F:
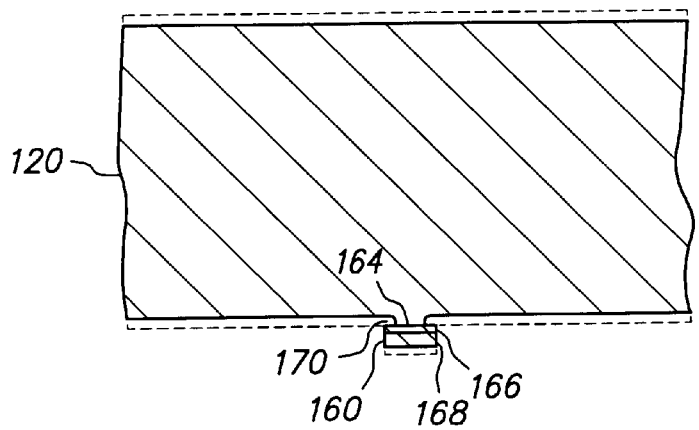
Figure 4G:
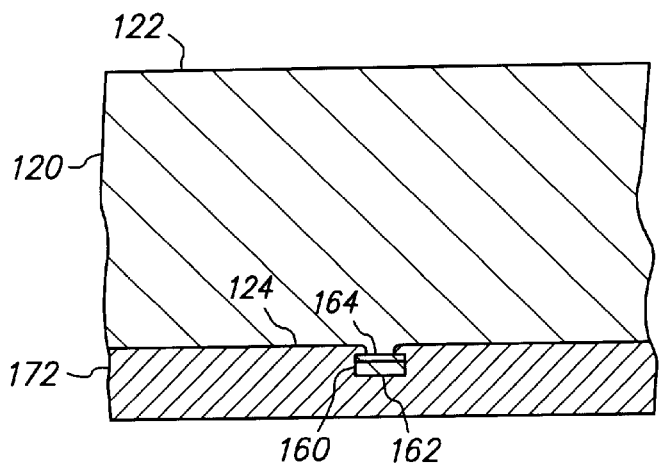
Figure 4H:
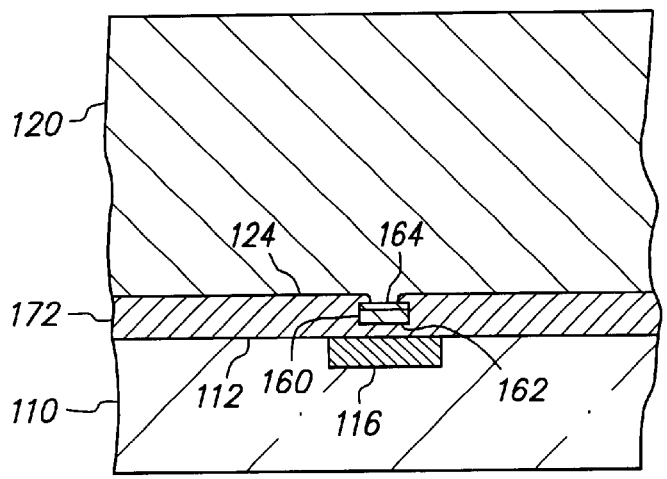
Figure 4I:
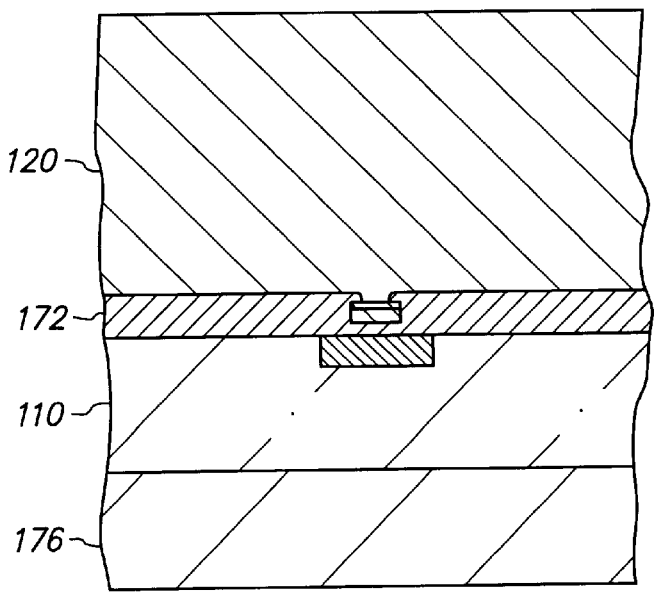
Figure 4J:
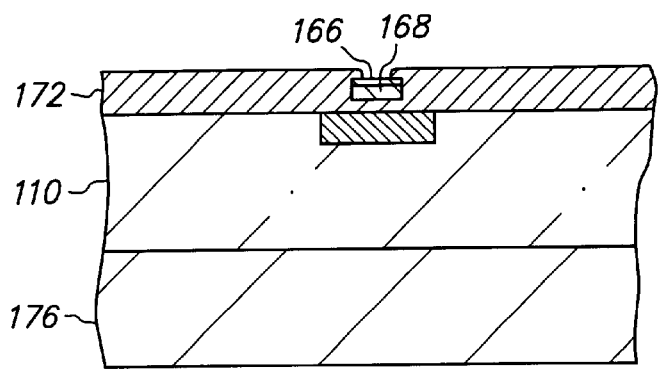
Figure 4K:
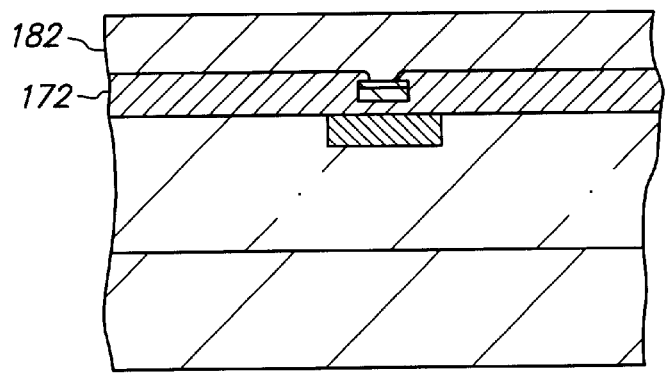
Figure 4L:
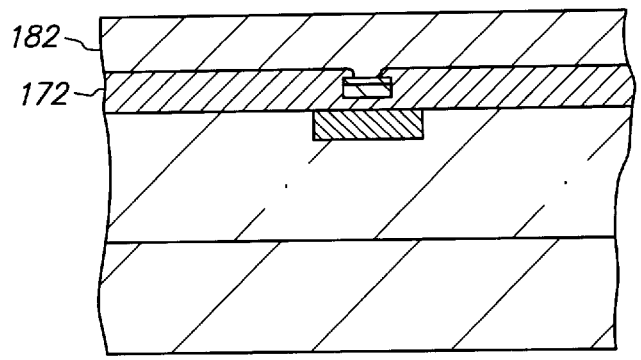
Figure 4M:
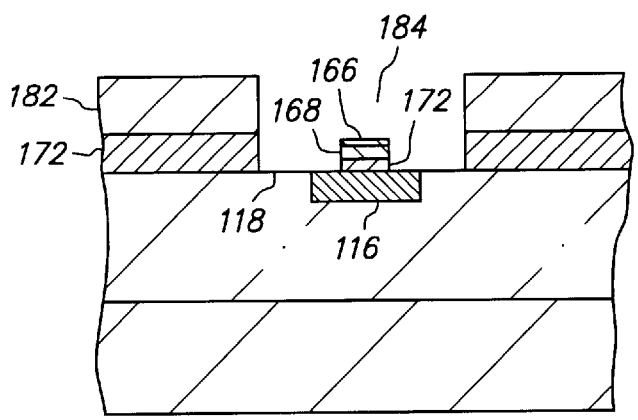
Figure 4N:
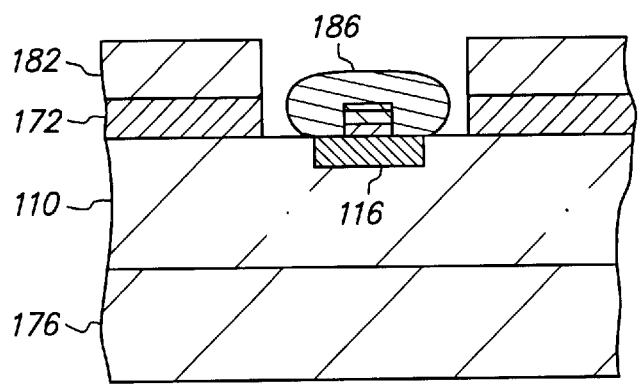
Figure 6A:
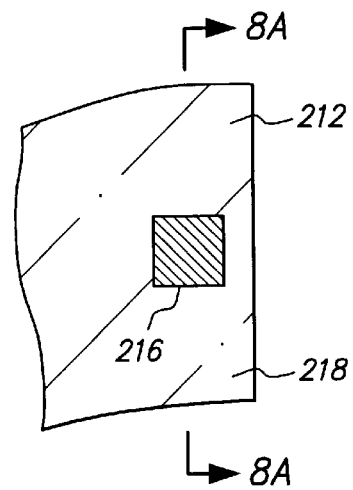
FIGS. 6A–6O are top plan views corresponding to FIGS. 5A–5O, respectively.
Figure 7A:
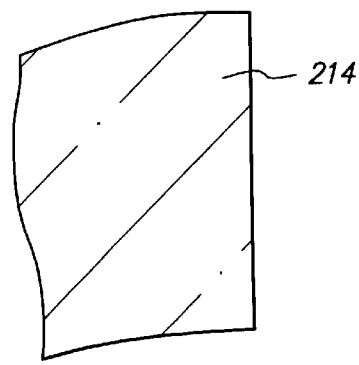
FIGS. 7A–7O are bottom plan views corresponding to FIGS. 5A–5O, respectively.
Figure 6B:
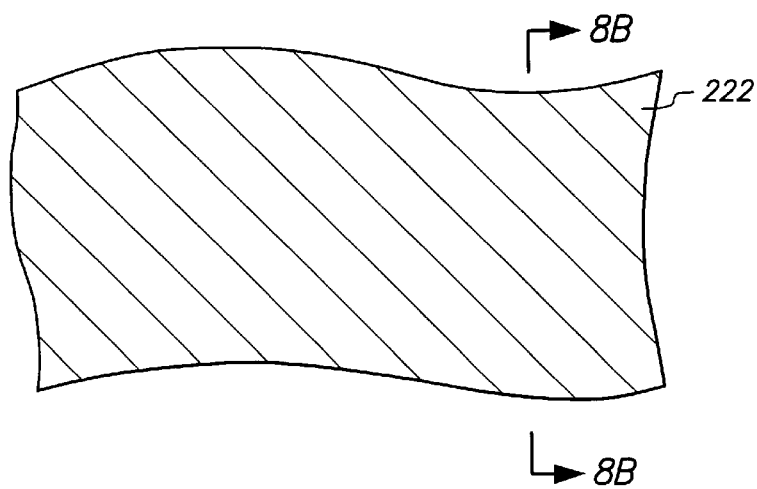
Figure 7B:
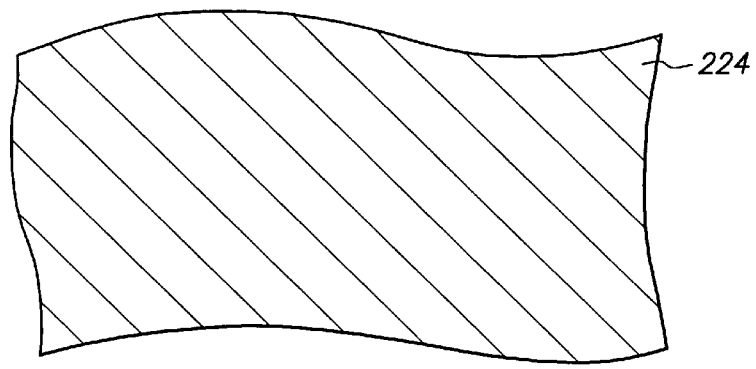
Figure 6C:
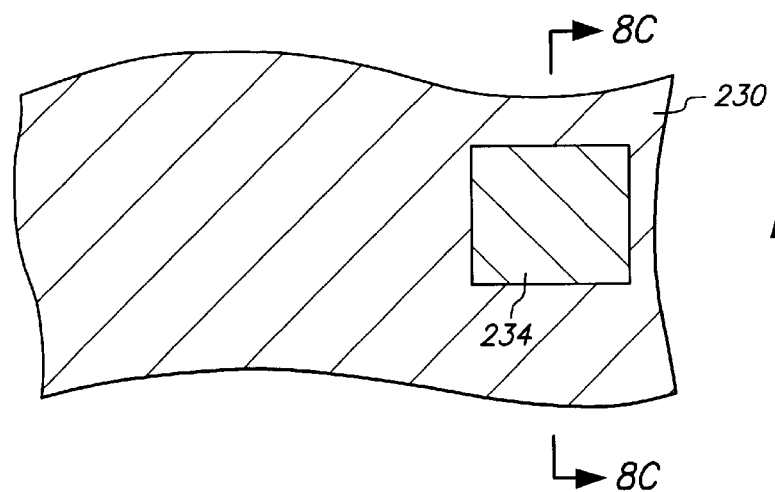
Figure 7C:
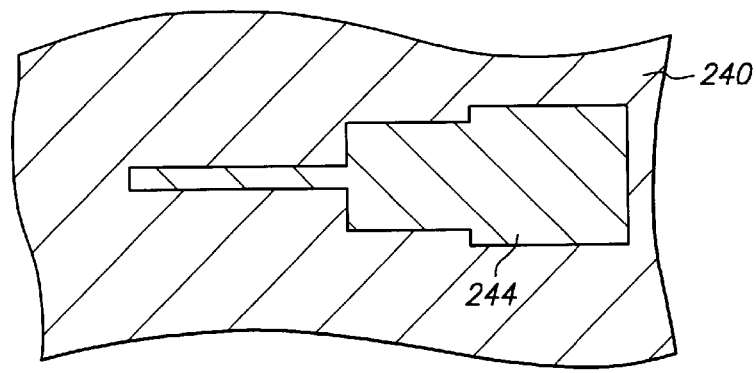
Figure 6D:
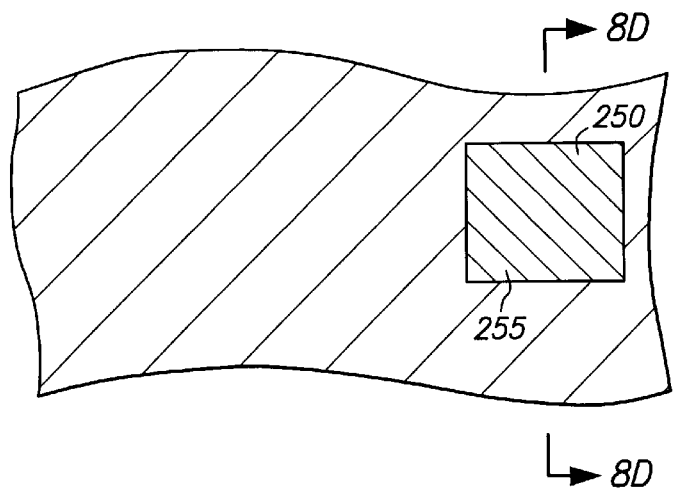
Figure 7D:
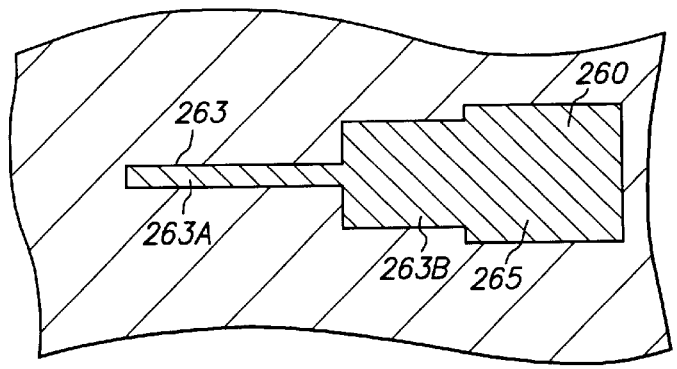
Figure 6E:
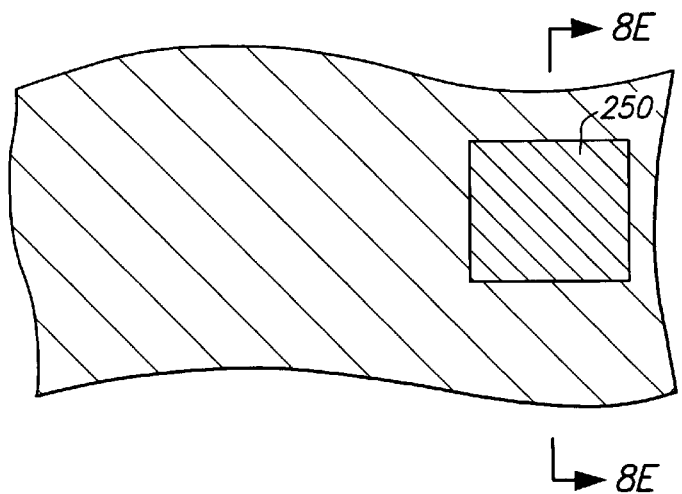
Figure 7E:
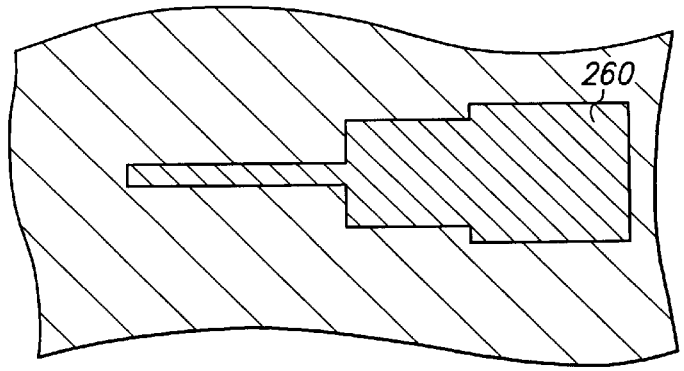

FIGS. 1A–1N, 2A–2N, 3A–3N and 4A–4N are cross-sectional, top, bottom and enlarged cross-sectional views, respectively, of a method of making a semiconductor chip assembly in accordance with a first embodiment of the present invention. FIGS. 4A–4N are oriented orthogonally with respect to FIGS. 1A–1N and depict enlarged views of portions of FIGS. 1A–1N.

FIGS. 1A, 2A, 3A and 4A are cross-sectional, top, bottom and enlarged cross-sectional views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 includes conductive pad 116 and passivation layer 118. Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid, at room temperature for 1 minute and then rinsed in distilled water. Thereafter, pad 116 is rendered catalytic to electrolessly plated nickel. Pad 116 can be rendered catalytic to electroless nickel by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation or electroplating using a mask which is a relatively complicated process. Alternatively, pad 116 can be rendered catalytic to electroless nickel by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. A suitable zinc solution is Enthone Alumon EN™ applied at room temperature. Thereafter, chip 110 is dipped in an electroless nickel plating solution, and a nickel surface layer is electrolessly deposited on the zincated aluminum base. The nickel surface layer is catalytic to electroless nickel. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and enlarged cross-sectional views, respectively, of metal base 120 which includes opposing major surfaces 122 and 124. Metal base 120 is a copper foil with a thickness of 150 microns.

FIGS. 1C, 2C, 3C and 4C are cross-sectional, top, bottom and enlarged cross-sectional views, respectively, of photoresist layers 130 and 140 formed on metal base 120. Photoresist layer 130 is deposited on surface 122 and photoresist layer 140 is deposited on surface 124 using a dry film lamination process in which hot rolls simultaneously press photoresist layers 130 and 140 onto surfaces 122 and 124, respectively. Thereafter, photoresist layers 130 and 140 are simultaneously patterned by selectively applying light through reticles (not shown), applying a developer solution to remove the photoresist portions rendered soluble by the light, and then hard baking, as is conventional. As a result, photoresist layer 130 contains opening 132 that selectively exposes portion 134 of surface 122, and photoresist layer 140 contains opening 142 that selectively exposes portion 144 of surface 124. Photoresist layers 130 and 140 each have a thickness of 15 microns.

FIGS. 1D, 2D, 3D and 4D are cross-sectional, top, bottom and enlarged cross-sectional views, respectively, of metal patterns 150 and 160 formed on metal base 120. Metal patterns 150 and 160 are simultaneously electroplated onto portions 134 and 144, respectively, of surfaces 122 and 124, respectively. Metal pattern 150 includes first and second opposing major surfaces 152 and 154, and metal pattern 160 includes first and second opposing major surfaces 162 and 164. Surfaces 152 and 162 face away from surfaces 122 and 124, respectively, and are exposed, and surfaces 154 and 164 face towards and contact surfaces 122 and 124, respectively. Metal pattern 150 is composed of nickel layer 156 electroplated onto metal base 120 and copper layer 158 electroplated onto nickel layer 156, and metal pattern 160 is composed of nickel layer 166 electroplated onto metal base 120 and copper layer 168 electroplated onto nickel layer 166. Thus, nickel layer 156 is sandwiched between and contacts metal base 120 and copper layer 158, nickel layer 166 is sandwiched between and contacts metal base 120 and copper layer 168, and copper layers 158 and 168 are separated from metal base 120. Metal pattern 150 includes enlarged rectangular portion 155, and metal pattern 160 includes routing line 163 and enlarged rectangular portion 165.

Metal patterns 150 and 160 are simultaneously formed by an electroplating operation. Thus, metal patterns 150 and 160 are formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, nickel layers 156 and 166 electroplate (deposit or grow) on exposed portions 134 and 144 of surfaces 122 and 124, respectively. The nickel electroplating operation continues until nickel layers 156 and 166 have the desired thickness. Thereafter, the structure is removed from the electrolytic nickel plating solution and submerged in an electrolytic copper plating solution such as Sel-Rex CUBATH M™ at room temperature while current is applied to the plating bus to electroplate copper layers 158 and 168 on nickel layers 156 and 166, respectively. The copper electroplating operation continues until copper layers 158 and 168 have the desired thickness. Thereafter, the structure is removed from the electrolytic copper plating solution and rinsed in distilled water to remove contaminants.

Metal patterns 150 and 160 each have a thickness of 9 microns, nickel layers 156 and 166 each have a thickness of 1 micron, and copper layers 158 and 168 each have a thickness of 8 microns. Routing line 163 has a width (orthogonal to its elongated length) of 30 microns, and enlarged rectangular portions 155 and 165 each have a width of 300 microns.

FIGS. 1E, 2E, 3E and 4E are cross-sectional, top, bottom and enlarged cross-sectional views, respectively, of metal base 120 and metal patterns 150 and 160 after photoresist layers 130 and 140 are stripped. At this stage, metal patterns 150 and 160 remain attached to metal base 120, surfaces 152 and 162 remain exposed, and surfaces 154 and 164 remain covered by metal base 120. The outer edges of metal pattern 150 (that extend between surfaces 152 and 154) and the outer edges of metal pattern 160 (that extend between surfaces 162 and 164) are exposed.

FIGS. 1F, 2F, 3F and 4F are cross-sectional, top, bottom and enlarged cross-sectional views, respectively, of metal base 120 and metal patterns 150 and 160 after micro-channels 170 are formed in metal base 120. Micro-channels 170 are formed by applying a wet chemical etch (or "micro-etch") that is highly selective of copper with respect to nickel, and therefore highly selective of metal base 120 and copper layers 158 and 168 with respect to nickel layers 156 and 166. The micro-etch is relatively brief and removes merely 3 microns from the exposed copper at surfaces 122, 124, 152 and 162, without removing an appreciable amount of nickel layers 156 and 166. As a result, the thickness of metal base 120 decreases by 6 microns outside metal patterns 150 and 160, and the thickness of copper layers 158 and 168 decreases by 3 microns. Furthermore, the micro-etch laterally undercuts metal base 120 adjacent to the sidewalls of nickel layers 156 and 166 using nickel layers 156 and 166 as etch masks. The undercut portions of metal base 120 adjacent to the sidewalls of nickel layer 156 are unimportant. However, the undercut portions of metal base 120 adjacent to the sidewalls of nickel layer 166 form microchannels 170, which will be useful in interlocking a conductive trace to the assembly as described below.

Micro-channels 170 expose portions of nickel layer 166 at surface 164 that face towards metal base 120 and were previously covered by metal base 120. Micro-channels 170 have tapered sidewalls that laterally extend about 3 microns into metal base 120 at the exposed portions of nickel layer 166 and slope outwardly as the vertical distance from nickel layer 166 increases. Furthermore, micro-channels 170 extend across the entire length of nickel layer 166 along the elongated outer edges of nickel layer 166. That is, two micro-channels 170 are each adjacent to opposing elongated outer edges of nickel layer 166 and extend 3 microns along surface 164 into the width of nickel layer 166. As a result, micro-channels 170 are separated from one another by metal base 120 across the remaining 24 micron (30–3–3) width of nickel layer 166.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing the structure to the wet chemical etch in order to form micro-channels 170 with the desired dimensions can be established through trial and error.

Figure 1A:
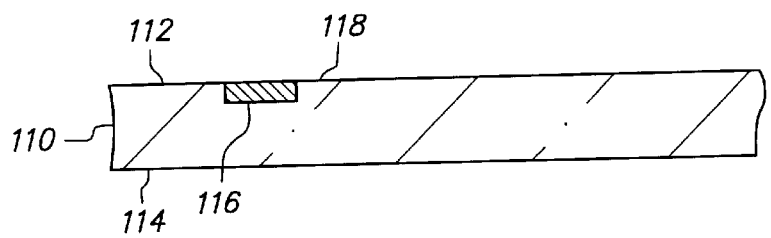
FIGS. 1A–1N are cross-sectional views showing a method of making a semiconductor chip assembly in accordance with a first embodiment of the present invention.
Figure 2A:
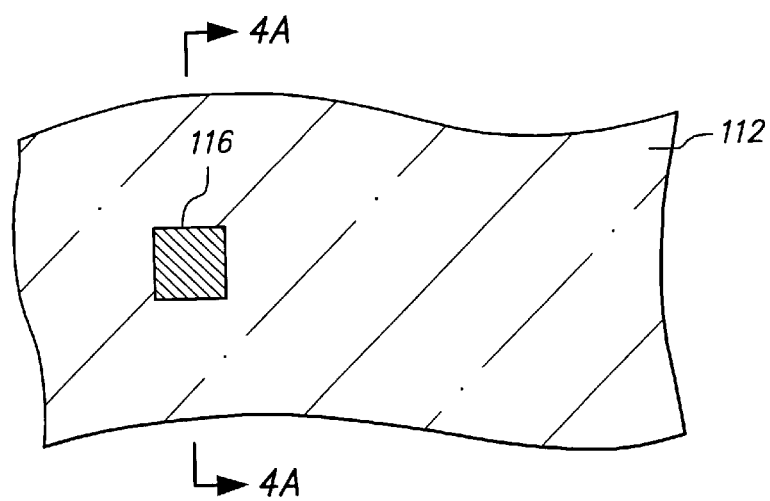
FIGS. 2A–2N are top plan views corresponding to FIGS. 1A–1N, respectively.
Figure 3A:
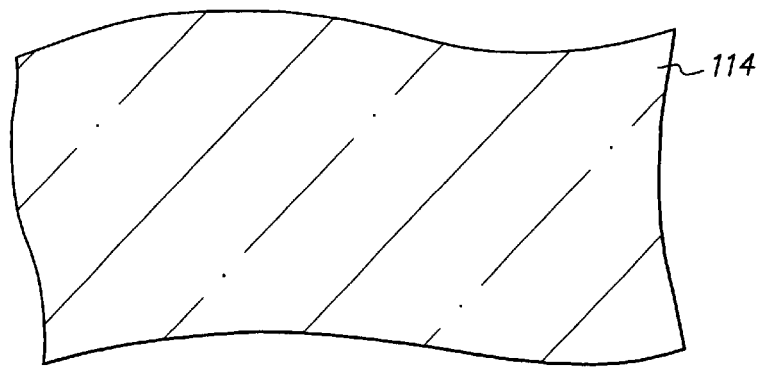
FIGS. 3A–3N are bottom plan views corresponding to FIGS. 1A–1N, respectively.
Figure 1B:
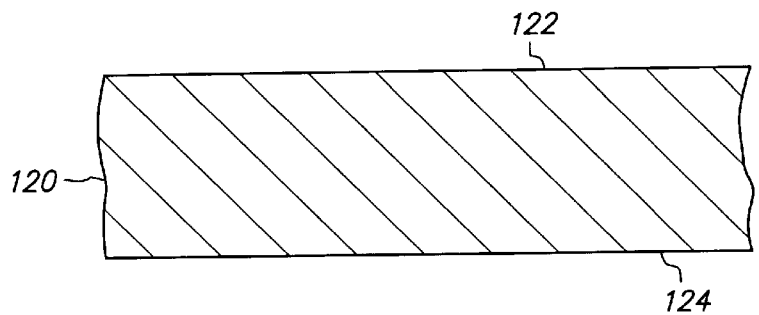
Figure 2B:
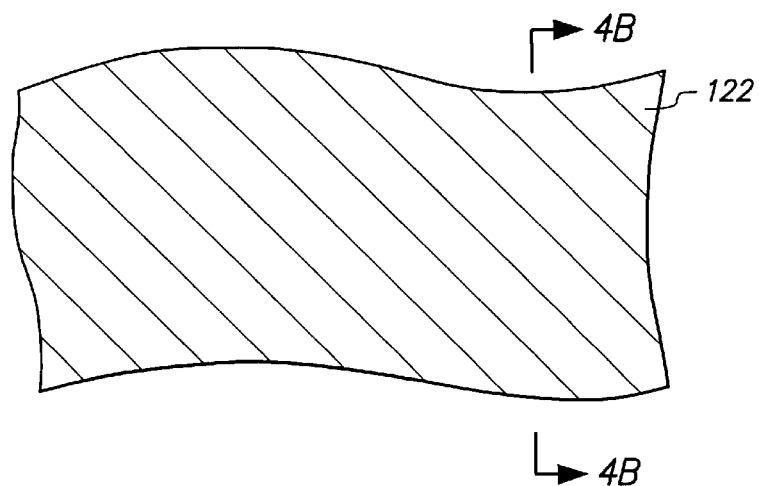
Figure 3B:
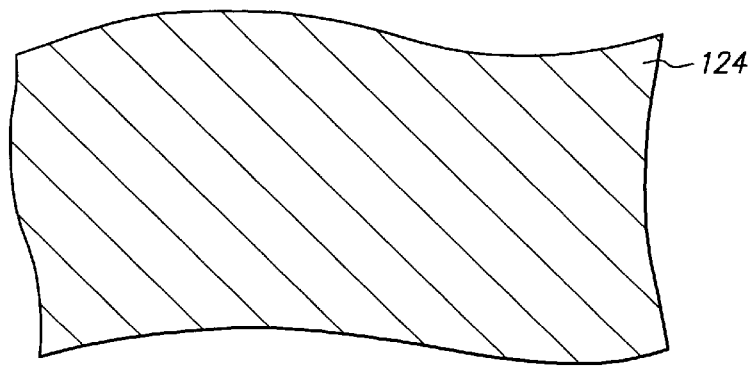
Figure 1C:
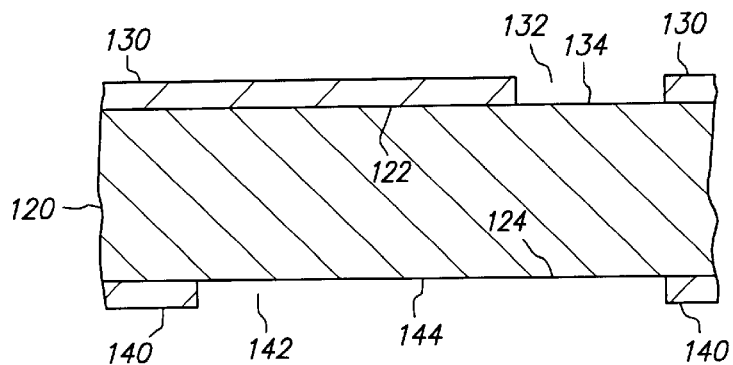
Figure 2C:
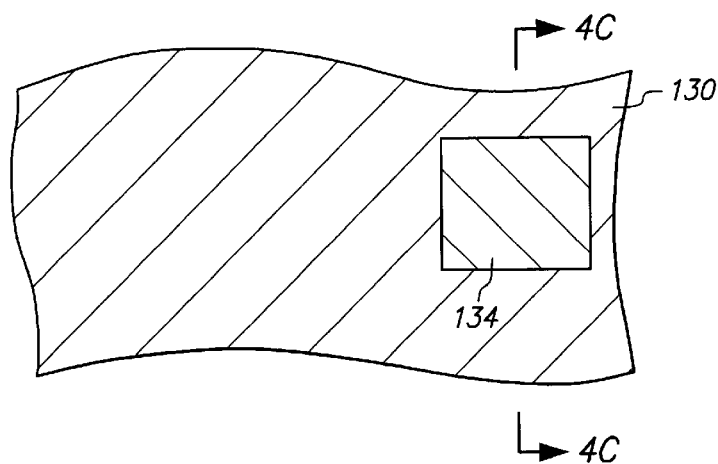
Figure 3C:
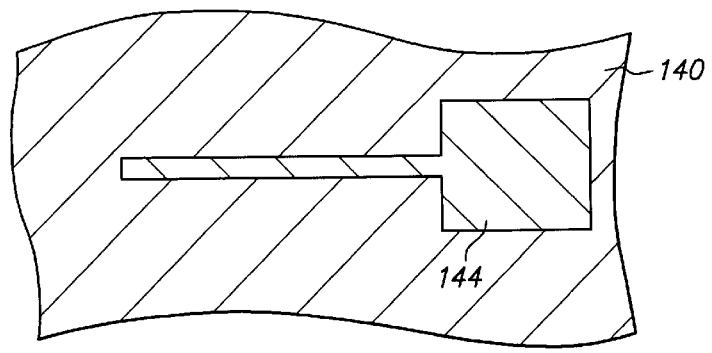
Figure 1D:
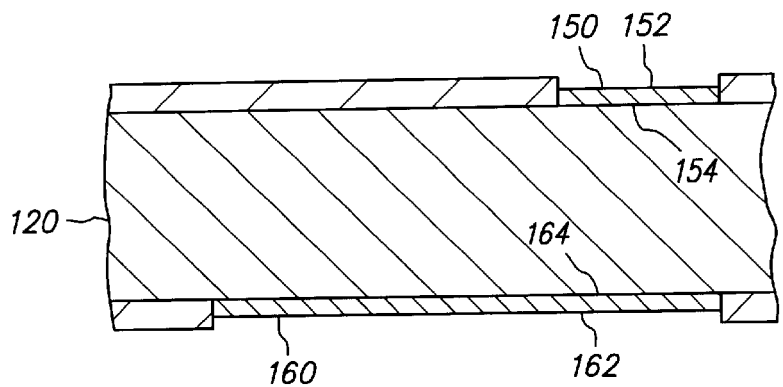
Figure 2D:
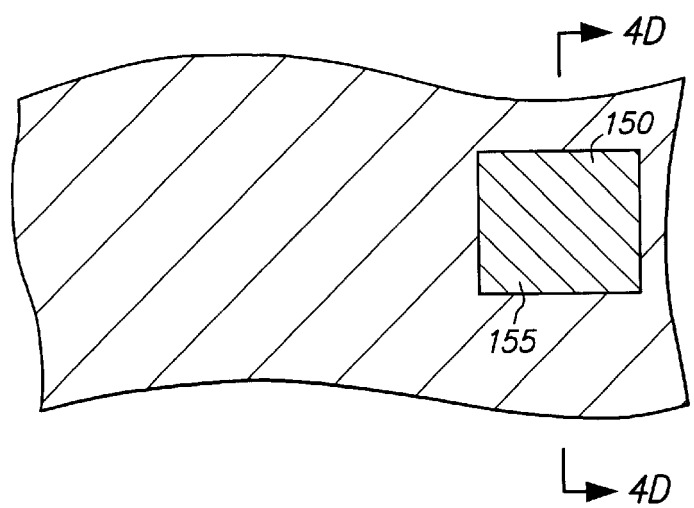
Figure 3D:
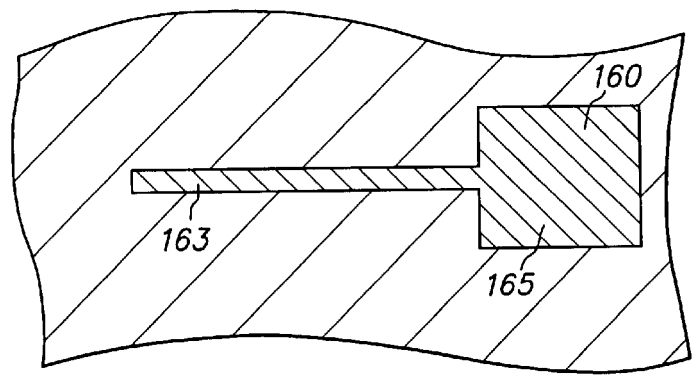
Figure 1E:
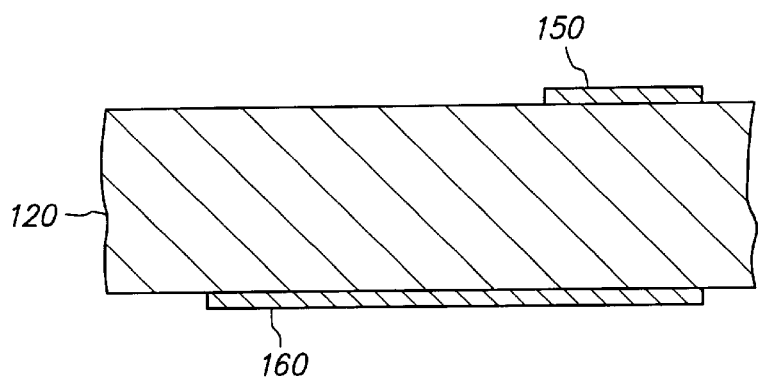
Figure 2E:
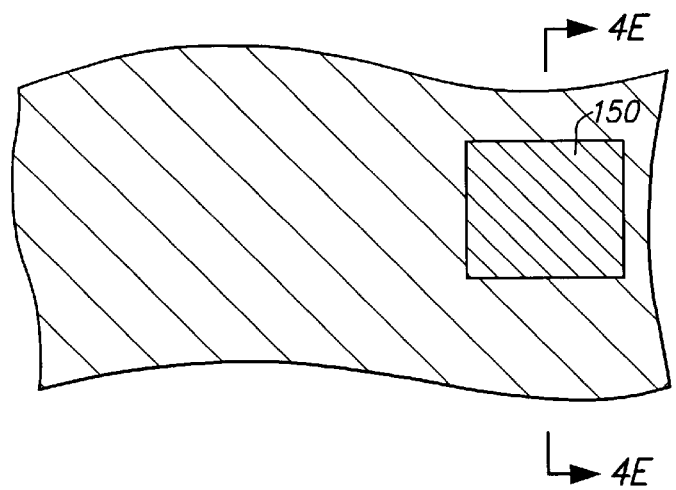
Figure 3E:
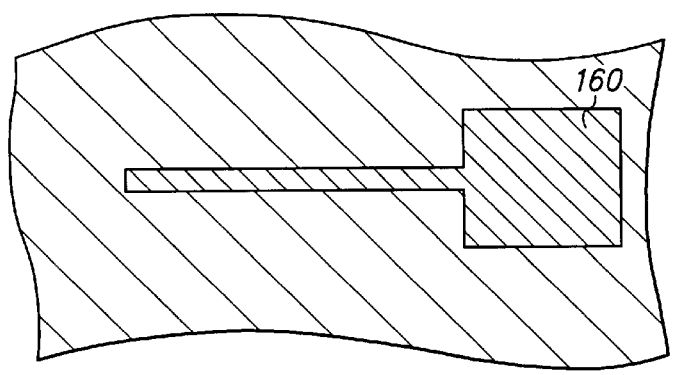
Figure 1F:
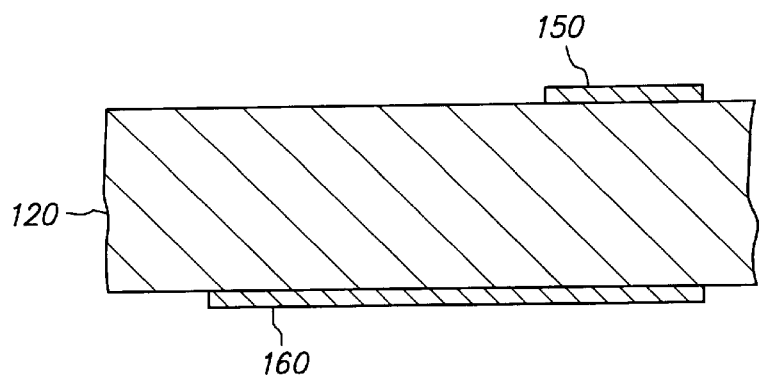
Figure 2F:
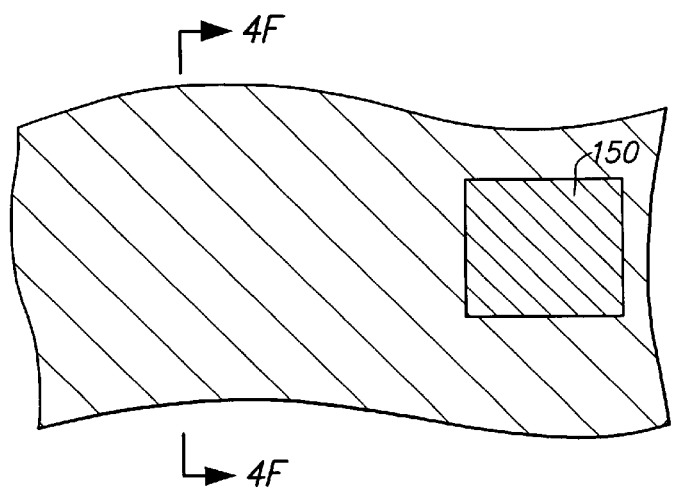
Figure 3F:
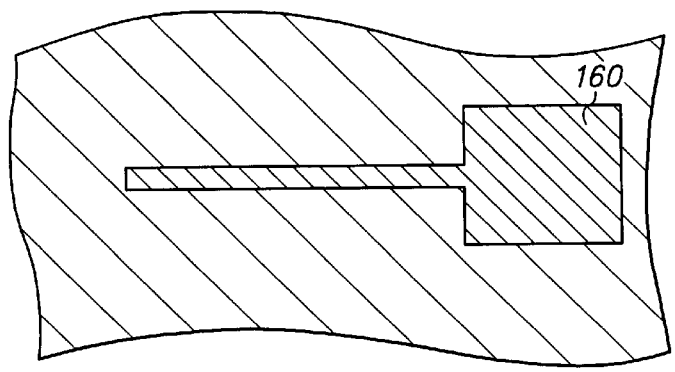
Figure 1G:
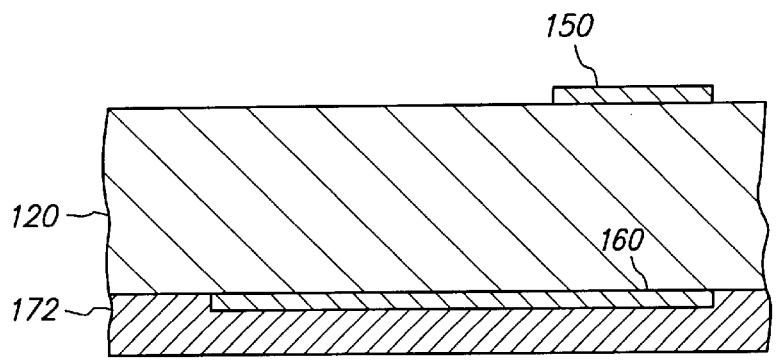
Figure 2G:
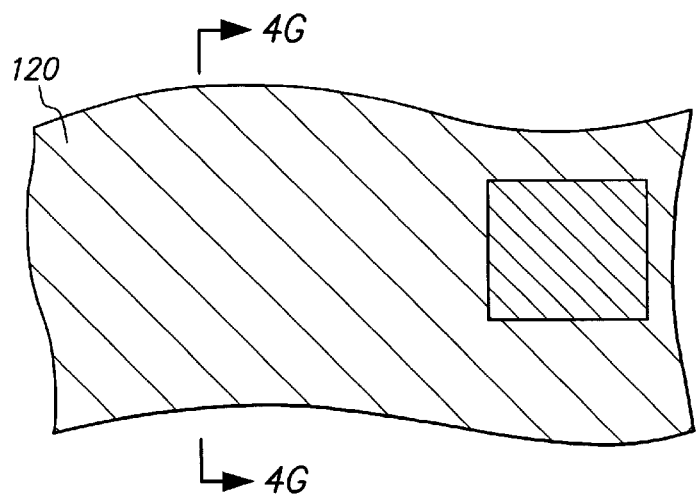
Figure 3G:
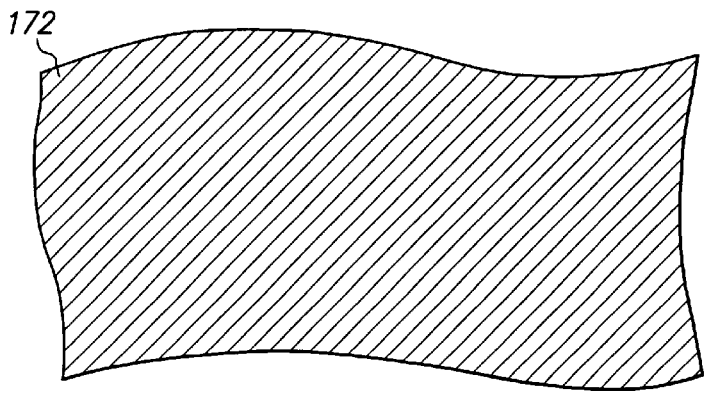
Figure 1H:
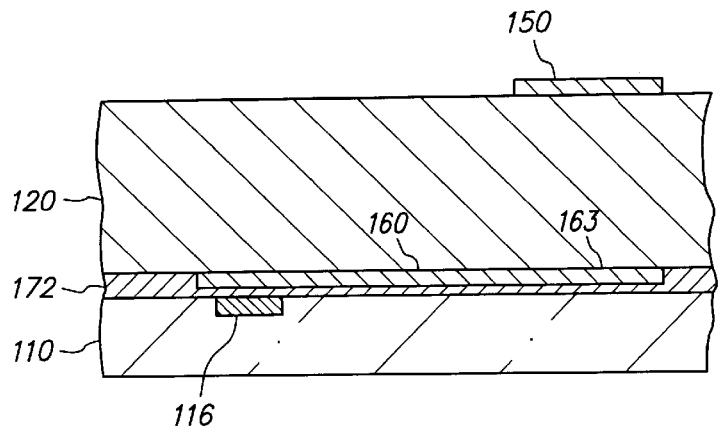
Figure 2H:
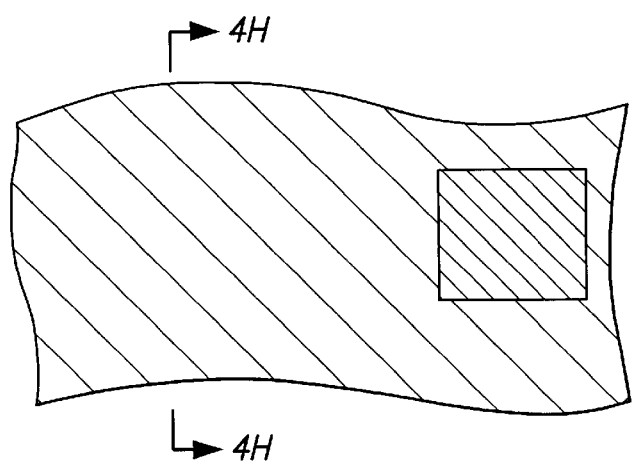
Figure 3H:
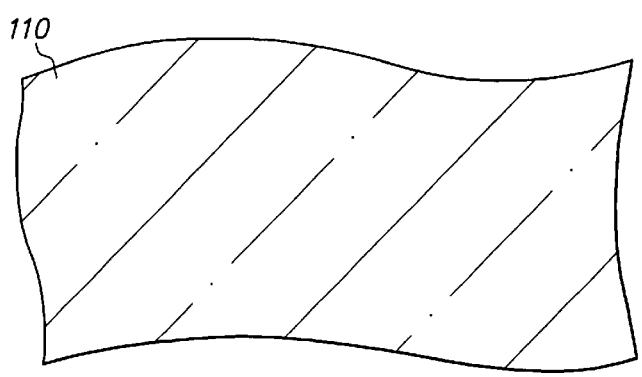
Figure 1I:
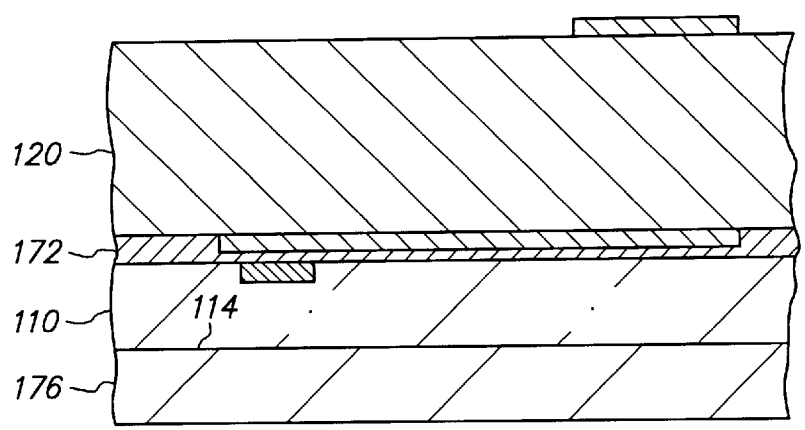
Figure 2I:
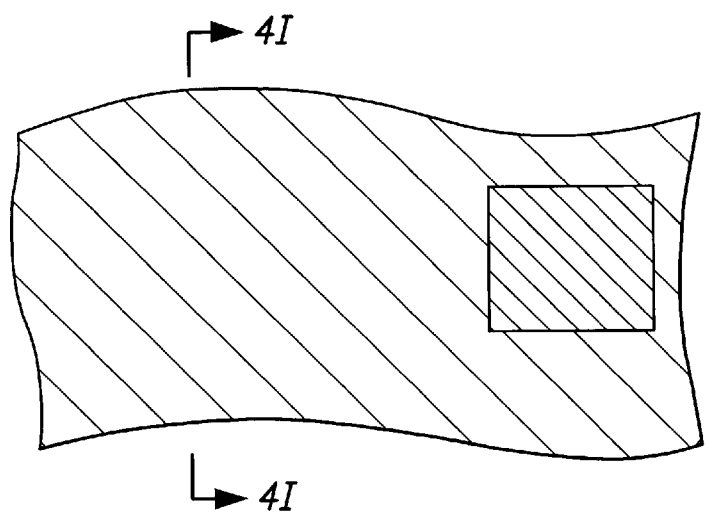
Figure 3I:
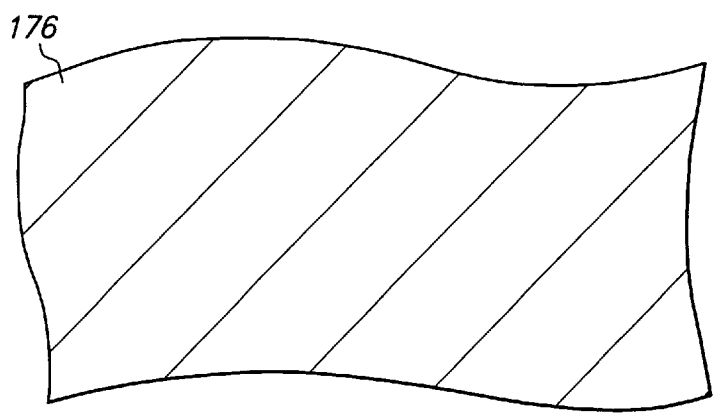
Figure 1J:
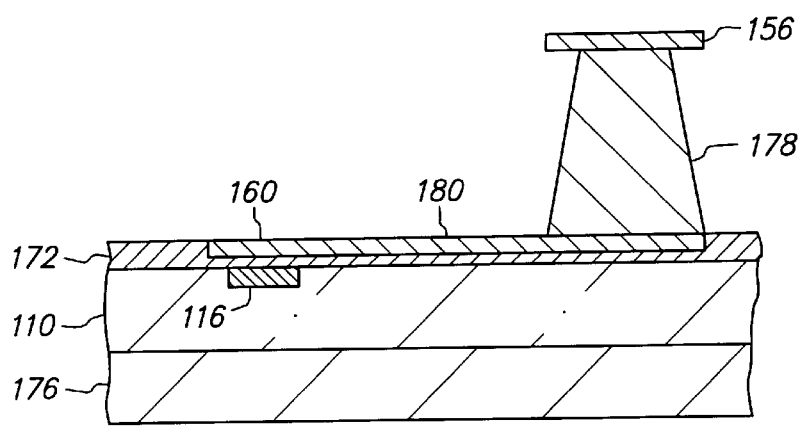
Figure 2J:
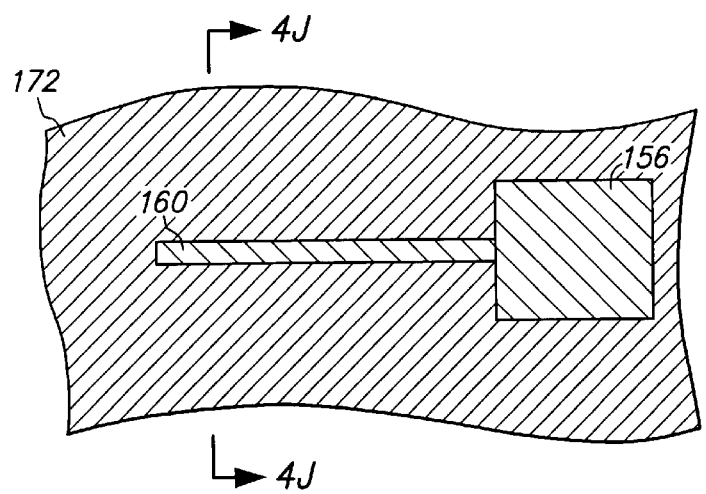
Figure 3J:
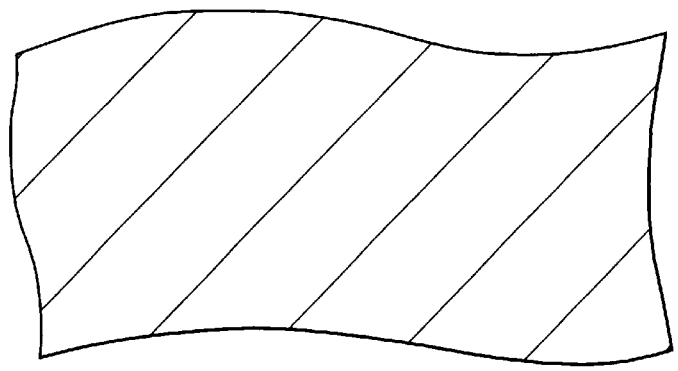
Figure 1K:
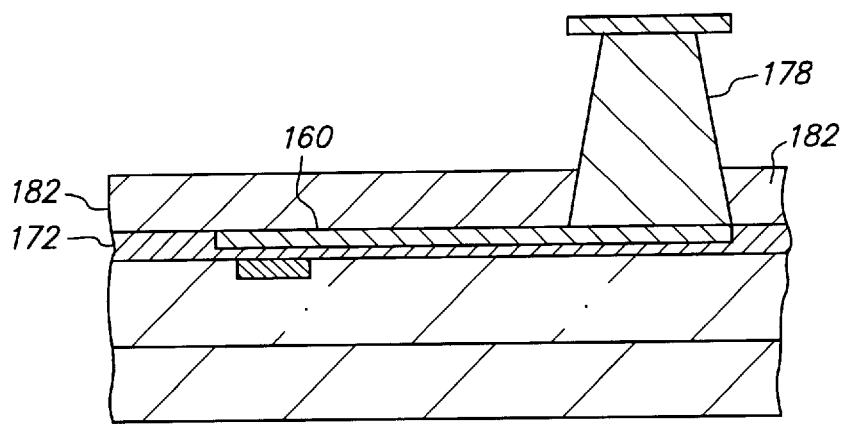
Figure 2K:
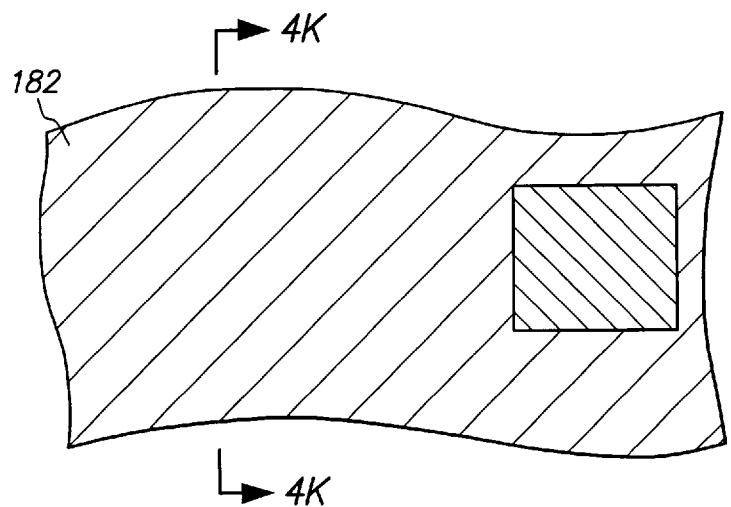
Figure 3K:
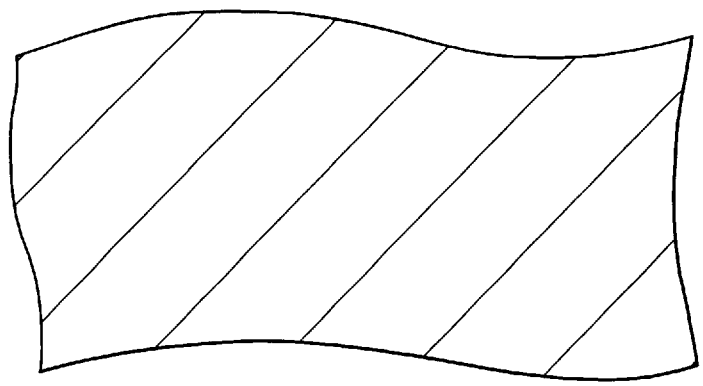
Figure 1L:
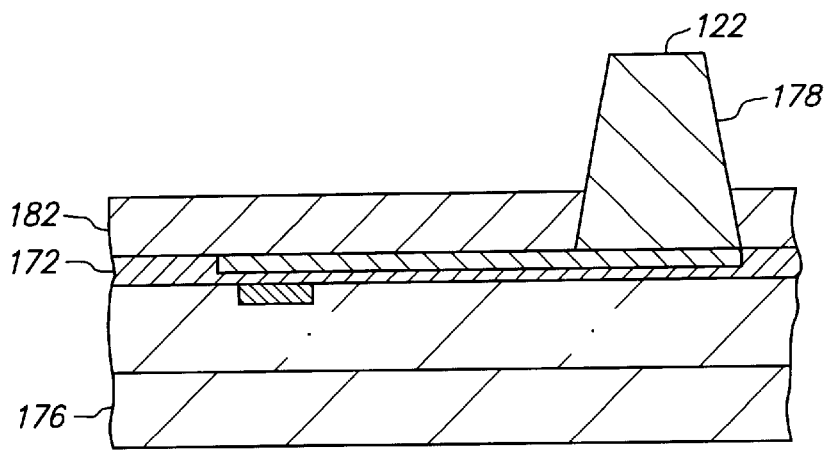
Figure 2L:
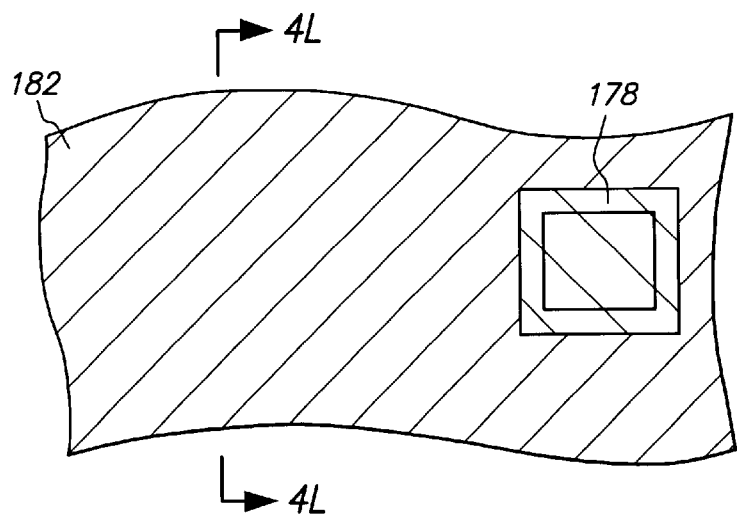
Figure 3L:
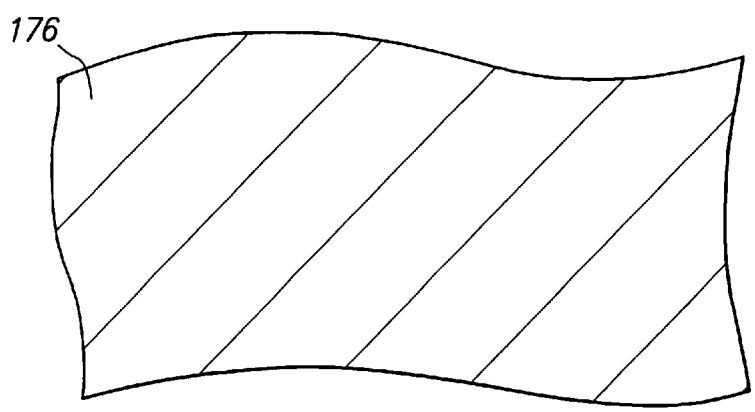
Figure 1M:
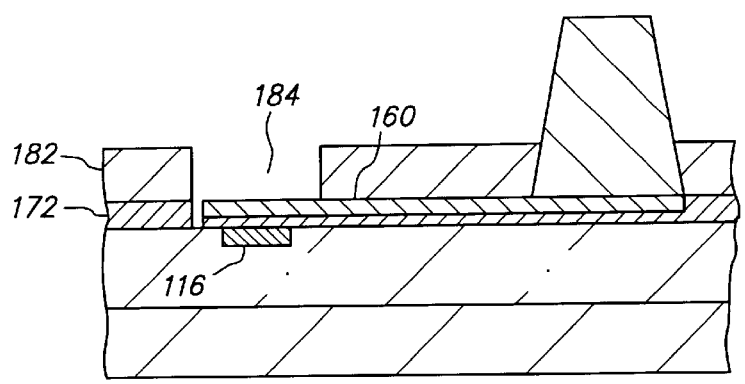
Figure 2M:
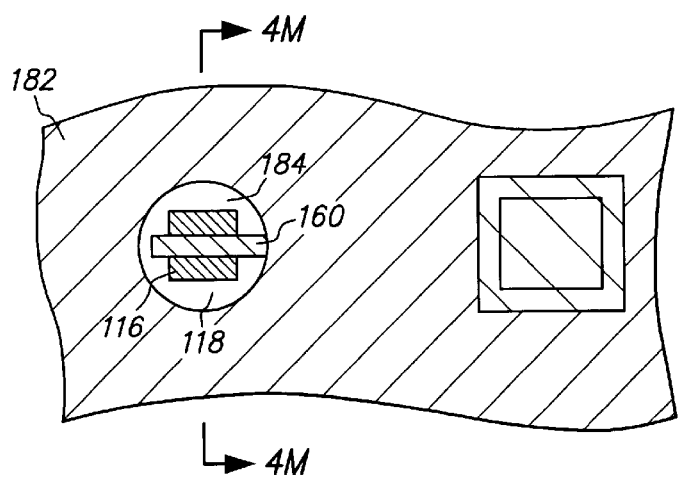
Figure 3M:
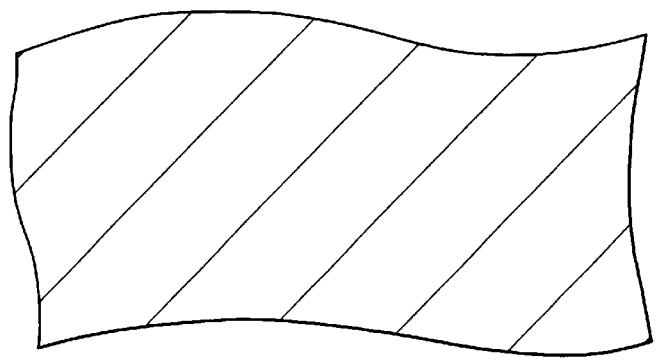
Figure 1N:
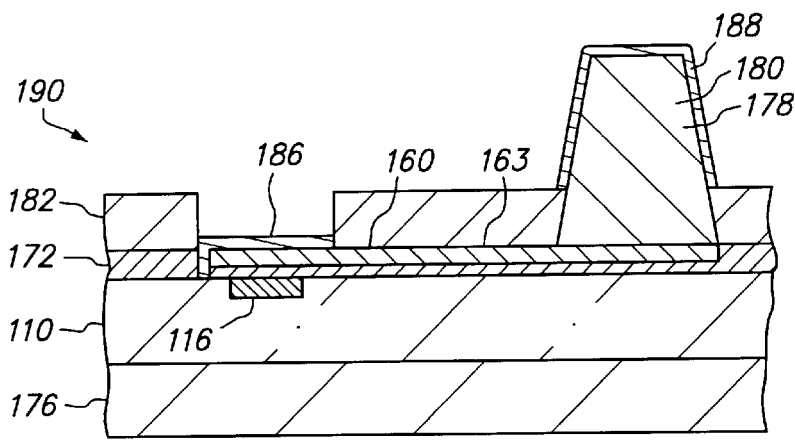
Figure 2N:
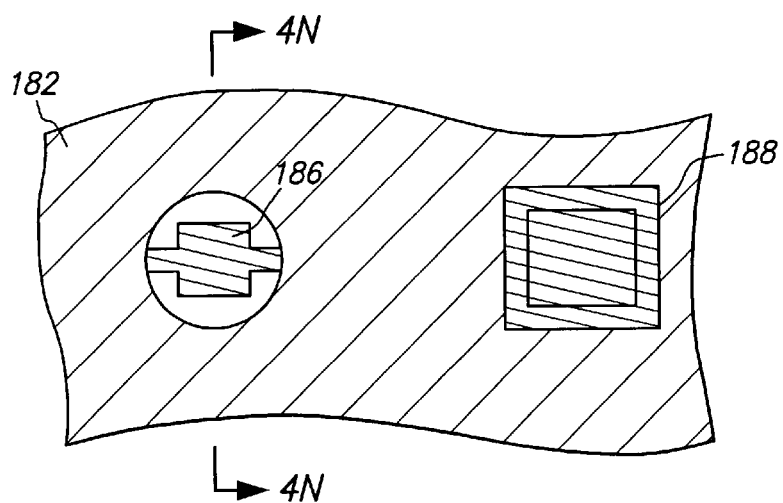
Figure 3N:
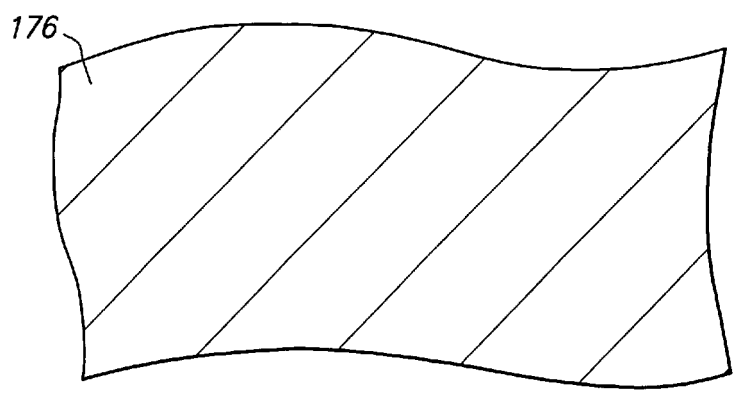

For convenience of illustration, the effects of the micro-etch are shown in FIG. 4F but not in FIGS. 1F, 2F or 3F. In addition, the surfaces of metal base 120 and copper layer 168 before the micro-etch are, shown in phantom in FIG. 4F.

FIGS. 1G, 2G, 3G and 4G are cross-sectional, top, bottom and enlarged cross-sectional views, respectively, of adhesive 172 formed on metal base 120 and metal pattern 160. Adhesive 172 may include an organic surface protectant such as HK 2000 which is promptly applied to the structure after the micro-etch to reduce native oxide formation on the exposed copper surfaces. The use of organic surface protectant layers in insulative adhesives for semiconductor chip assemblies is well-known in the art. Thereafter, a liquid resin (A stage) such as polyamic acid is applied over a predetermined portion of the structure using stencil printing. The liquid resin flows over surfaces 124 and 162 of metal base 120 and metal pattern 160, respectively, flows over the outer edges of metal pattern 160, and flows over surface 164 of metal pattern 160 and into micro-channels 170. Adhesive 172 has a thickness of 30 microns as measured from metal base 120 outside metal pattern 160. Adhesive 172 covers metal pattern 160 and a predetermined portion of surface 124 and fills portions of micro-channels 170. However, adhesive 172 does not contact surface 122 or metal pattern 150.

For convenience of illustration, adhesive 172 is shown below metal base 120 to retain a single orientation throughout the figures for ease of comparison between the figures, although in this step the structure would be inverted so that gravitational force would assist the liquid resin with flowing into micro-channels 170.

FIGS. 1H, 2H, 3H and 4H are cross-sectional, top, bottom and enlarged cross-sectional views, respectively, of chip 110 mechanically attached to metal base 120 and metal pattern 160 by adhesive 172. Adhesive 172 is disposed between and contacts surface 112 of chip 110 and surface 124 of metal base 120, and likewise, adhesive 172 is disposed between and contacts surface 112 of chip 110 and surface 162 of metal pattern 160. Thus, chip 110 and metal base 120 do not contact one another, and chip 110 and metal pattern 160 do not contact one another.

Chip 110 and metal base 120 are positioned relative to one another so that chip 110 is disposed and centered within the surface area of adhesive 172, routing line 163 is disposed above and overlaps and is electrically isolated from pad 116, and enlarged rectangular portions 155 and 165 are disposed within the periphery of chip 110 and outside the periphery of pad 116. Chip 110 and metal base 120 can be aligned using an automated pattern recognition system. Adhesive 172 is sandwiched between surface 112 and surface 124, and between surface 112 and surface 162, using relatively low pressure. Thereafter, adhesive 172 is heated and fully cured (C stage) at relatively low temperature in the range of 200 to 250° C. to form a solid adhesive electrically insulative polyimide layer that mechanically fastens chip 110 to metal base 120 and metal pattern 160. Moreover, adhesive 172 extends into micro-channels 170 and contacts surface 164 adjacent to micro-channels 170, thereby interlocking metal pattern 160 to adhesive 172 and enhancing the mechanical attachment between metal pattern 160 and adhesive 172. Adhesive 172 is 3 microns thick between pad 116 and surface 162.

FIGS. 1I, 2I, 3I and 4I are cross-sectional, top, bottom and enlarged cross-sectional views, respectively, of encapsulant 176 formed on chip 110 and metal base 120 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art. Encapsulant 176 contacts surface 114 of chip 110 without contacting surface 122 or metal pattern 150. Encapsulant 176 is a solid adherent compressible protective layer that provides back-side environmental protection such as moisture resistance and particle protection for chip 110. Encapsulant 176 is 100 microns thick beyond surface 114.

FIGS. 1J, 2J, 3J and 4J are cross-sectional, top, bottom and enlarged cross-sectional views, respectively, of the structure after a portion of metal base 120 within the periphery of pad 116 is removed and a remaining portion of metal base 120 within the periphery of chip 110 remains to form pillar 178. This is accomplished by applying a wet chemical etch using nickel layer 156 as an etch mask. The wet chemical etch is highly selective of copper with respect to nickel, polyimide and the molding compound, and therefore, highly selective of metal base 120 with respect to nickel layers 156 and 166, adhesive 172 and encapsulant 176. Therefore, copper layer 158 is removed, but no appreciable amount of nickel layer 156, nickel layer 166, adhesive 172 or encapsulant 176 is removed. Nickel layer 166 protects the underlying copper layer 168 from the etch.

Since the wet chemical etch laterally, undercuts metal base 120 beneath nickel layer 156, pillar 178 tapers inwardly with increasing height. A suitable taper is between 45 and slightly less than 90 degrees, such as approximately 75 degrees. Furthermore, pillar 178 has a flat top portion at surface 122. Metal pattern 160 and pillar 178 in combination provide conductive trace 180 that is adapted for providing horizontal and vertical routing between pad 116 and a terminal on a printed circuit board (not shown) in a next level assembly.

A suitable wet chemical etch can be provided by the same solution used for the micro-etch. The optimal etch time for exposing the structure to the wet chemical etch in order to completely remove metal base 120 within the periphery of pad 116 and form pillar 178 with the desired dimensions can be established through trial and error.

At this stage, adhesive 172 continues to cover pad 116, adhesive 172 provides mechanical support for metal pattern 160, and encapsulant 176 provides protection for chip 110. The portions of adhesive 172 that extend into microchannels 170 provide elongated flanges that extend along the length of surface 164 of metal pattern 160, thereby interlocking metal pattern 160 to adhesive 172 and enhancing the mechanical attachment between metal pattern 160 and adhesive 172.

FIGS. 1K, 2K, 3K and 4K are cross-sectional, top, bottom and enlarged cross-sectional views, respectively, of insulative base 182 formed on metal pattern 160, adhesive 172 and pillar 178. Insulative base 182 is relatively flat and has a thickness of 50 microns. Although insulative base 182 covers metal pattern 160, adhesive 172 and a lower portion of pillar 178, an upper portion of pillar 178 extends about 90 microns above insulative base 182. Preferably, insulative base 182 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively coated over metal pattern 160, adhesive 172 and the lower portion of pillar 178 but not the upper portion of pillar 178 using screen printing, and then the epoxy is cured or hardened at relatively low temperature in the range of 100–250° C. to form a solid adherent insulative layer that provides additional mechanical strength and protection for assembly. For instance, if a solder joint is subsequently formed over pillar 178 during the next level assembly, insulative base 182 protects the underlying metallization from unwanted solder reflow.

FIGS. 1L, 2L, 3L and 4L are cross-sectional, top, bottom and enlarged cross-sectional views, respectively, of the structure after metal pattern 150 is removed using a nickel etching solution that is highly selective of nickel with respect to polyimide, epoxy and molding compound. A suitable nickel etching solution is a dilute mixture of nitric and hydrochloric acid. Since nickel layer 156 is extremely thin relative to pillar 178, and the structure is removed from the nickel etching solution immediately after nickel layer 156 is stripped, it is not critical that the nickel etching solution be highly selective of nickel with respect to copper. The nickel etching solution has no significant impact on pillar 178. Furthermore, insulative base 182 protects nickel layer 166 from the nickel etching solution. Therefore, no appreciable amount of metal pattern 160, adhesive 172, encapsulant 176, pillar 178 or insulative base 182 is removed. Stripping metal pattern 150 exposes pillar 178 at surface 122.

FIGS. 1M, 2M, 3M and 4M are cross-sectional, top, bottom and enlarged cross-sectional views, respectively, of the structure after portions of adhesive 172 and insulative base 182 are selectively removed to form opening 184 in adhesive 172 and insulative base 182 that exposes pad 116 and metal pattern 160. Opening 184 is formed by applying a suitable etch that is highly selective of adhesive 172 and insulative base 182 with respect to pad 116 and nickel layer 166.

In this instance, a selective laser etch is applied. Using projection laser ablation, a metal mask (not shown) is positioned above surface 122 such that an opening in the metal mask is aligned with pad 116, and a laser is directed to the side of the metal mask opposite surface 122. Accordingly, the metal mask targets the laser at pad 116. The laser removes portions of adhesive 172 and insulative base 182 above nickel layer 166 and removes portions of adhesive 172 and insulative base 182 above pad 116 and outside nickel layer 166. Opening 184 has a diameter of 100 microns, and pad 116 (with a length and width of 70 microns) is centered within and axially aligned with opening 184. Nickel layer 166 shields the underlying adhesive 172 from the laser etch so that the portion of adhesive 172 sandwiched between routing line 163 and pad 116 remains intact. Opening 184 is formed in adhesive 172 and insulative base 182 without damaging pad 116, passivation layer 118 or routing line 163.

FIGS. 1N, 2N, 3N and 4N are cross-sectional, top, bottom and enlarged cross-sectional views, respectively, of connection joint 186 formed on pad 116 and routing line 163, and contact terminal formed on pillar 178, by electroless plating.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus.

In order to initiate electroless deposition of connection joint 186, the partially completed assembly is dipped in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

The nickel is amorphous and does not deposit on passivation layer 118, adhesive 172, encapsulant 176 or insulative base 182, and therefore a mask is not necessary. Routing line 163 includes nickel layer 166 which is catalytic to electroless nickel, and pad 116 includes a nickel surface layer that is catalytic to electroless nickel. Therefore, connection joint 186 initially includes a first portion that begins to plate on pad 116 and a second portion that begins to plate on routing line 163, although the first and second connection joint portions do not contact one another and pad 116 remains electrically isolated from routing line 163.

Shortly after connection joint 186 begins to deposit on nickel layer 166, it changes the electrochemical potential of conductive trace 180 by a small amount such as 0.2 volts. As a result, copper layer 168 and pillar 178 (which also is copper) become catalytic to electroless nickel, connection joint 186 simultaneously deposits on pad 116, nickel layer 166 and copper layer 168, and contact terminal 188 deposits on the exposed upper portion of pillar 178.

As the electroless nickel plating operation continues, and the separate connection joint portions continue to plate on pad 116 and routing line 163, the connection joint portions eventually contact one another and metallurgically merge into a single continuous nickel joint that electrically connects pad 116 and routing line 163. At this point, connection joint 186 and contact terminal 188 are each primarily nickel, contain about 4 to 9 weight percentage phosphorus and are 8 microns thick.

Thereafter, the assembly is removed from the electroless nickel plating solution and briefly submerged in an electroless gold plating solution such as is MacDermid PLA-NAR™ at 70° C. Advantageously, the gold deposits on the nickel without depositing on passivation layer 118, adhesive 172, encapsulant 176 or insulative base 182, and therefore a mask is not necessary. Thereafter, the assembly is removed from the electroless gold plating solution and rinsed in distilled water.

The gold surface layer is relatively thin, with a thickness on the order of 0.25 microns. Thus, connection joint 186 and contact terminal 188 each consist of an 8 micron thick buried nickel layer covered by a 0.25 micron thick gold surface layer. For convenience of illustration, the buried nickel layer and the gold surface layer are shown as a single layer. The buried nickel layer provides the primary mechanical and electrical connection for connection joint 186. The gold surface layer provides a wettable surface for contact terminal 188 so that a solder ball (not shown) can be subsequently deposited over pillar 178 and reflowed during the next level assembly but is of relatively little importance to connection joint 186.

Connection joint 186 is formed in opening 184 and contacts and electrically connects pad 116 and routing line 163. Connection joint 186 contacts and covers portions of pad 116 beneath opening 184 and outside routing line 163 as well as surface 164 of routing line 163 and the outer edges of routing line 163. Thus, connection joint 186 provides a robust, permanent electrical connection between pad 116 and routing line 163. Connection joint 186 is the only electrical conductor external to chip 110 that contacts pad 116, adhesive 172 and connection joint 186 are the only materials external to chip 110 that contact pad 116, and adhesive 172 and connection joint 186 are the only materials that contact both pad 116 and routing line 163.

At this stage, the manufacture of semiconductor chip assembly 190 that includes chip 110, adhesive 172, encapsulant 176, conductive trace 180, insulative base 182, connection joint 186 and contact terminal 188 can be considered complete. Conductive trace 180 is mechanically coupled to chip 110 by adhesive 172, and is electrically coupled to chip 110 by connection joint 186. Conductive trace 180 provides horizontal fan-in routing (via metal pattern 160) and vertical routing (via pillar 178) between pad 116 and external circuitry. Encapsulant 176 and insulative base 182 provide environmental protection for the assembly. Moreover, adhesive 172 interlocks conductive trace 180 to chip 110 using flange portions in micro-channels 170.

The semiconductor chip assembly includes other conductive traces embedded in adhesive 172, and only a single conductive trace 180 is shown for convenience of illustration. The conductive traces are each connected to a respective pad on chip 110 by a respective connection joint. Furthermore, the conductive traces each extend horizontally from their respective pads and contain a pillar at a distal end within the periphery of chip 110 to provide horizontal fan-in routing and vertical routing for their respective pads. The conductive traces are electrically isolated from one another by adhesive 172 after metal base 120 is removed. Advantageously, since metal base 120 provides a plating bus for forming the conductive traces, and the connection joints are formed by electroless plating, there is no plating bus or related circuitry that need be disconnected or severed from chip 110 or the conductive traces after metal base 120 is etched and the connection joints are formed. If desired, solder balls can be screen printed on the tops of the contact terminals to provide connections to the next level assembly.

Figure 8A:
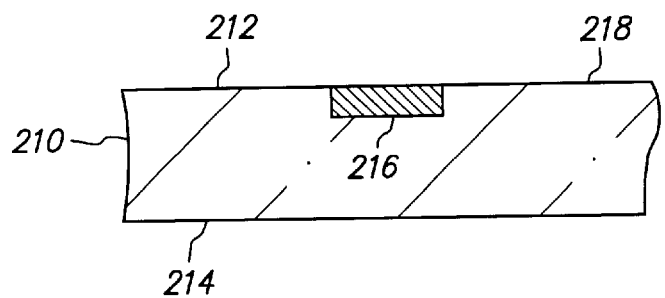
FIGS. 8A–8O are enlarged cross-sectional views corresponding to FIGS. 5A–5O, respectively.
Figure 8B:
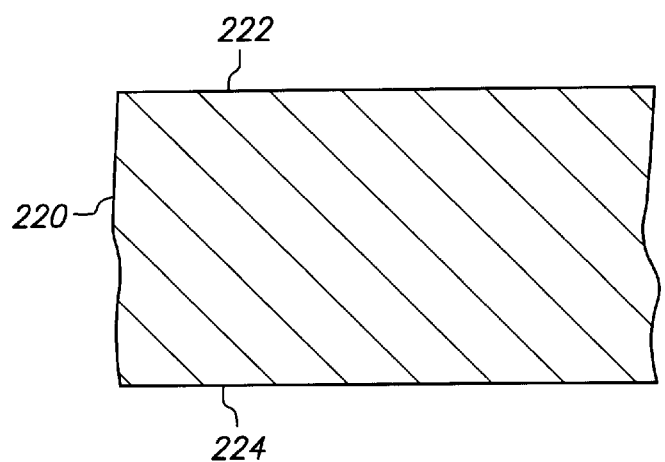
Figure 8C:
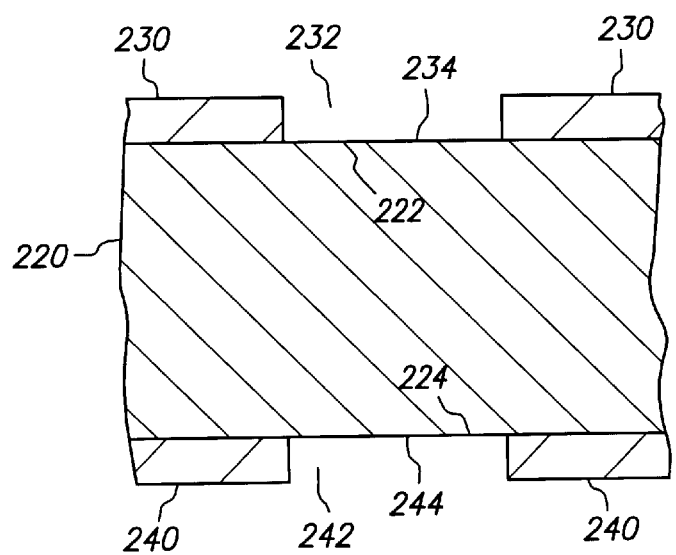
Figure 8D:
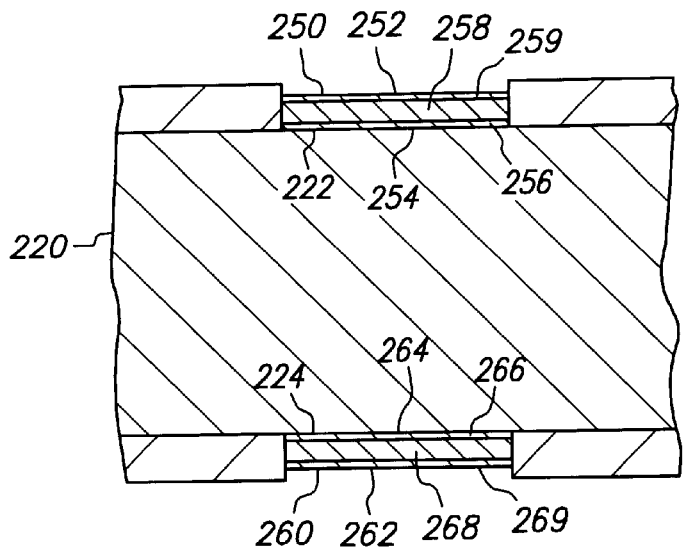
Figure 8E:
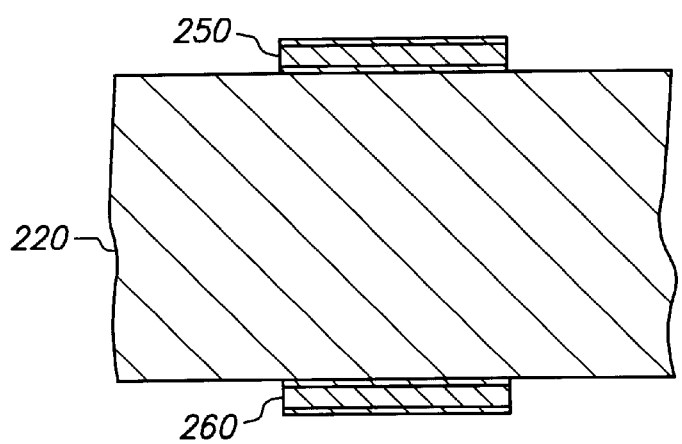
Figure 8F:
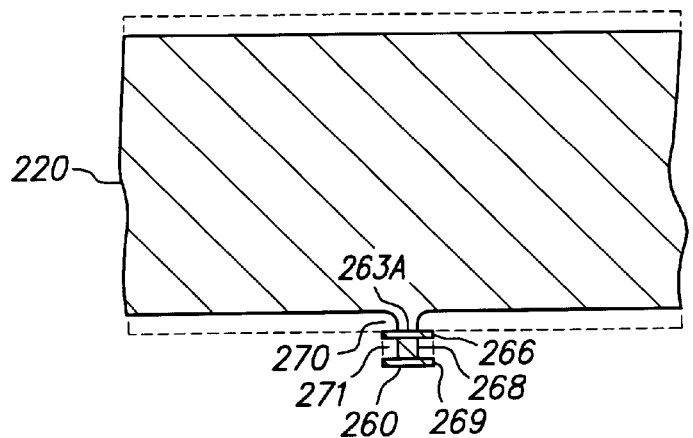
Figure 8G:
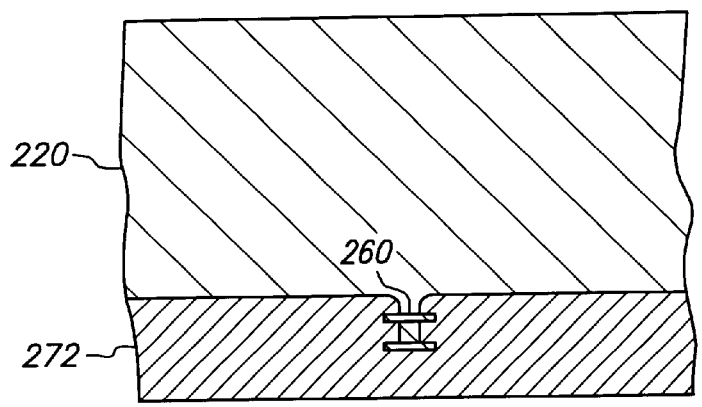
Figure 8H:
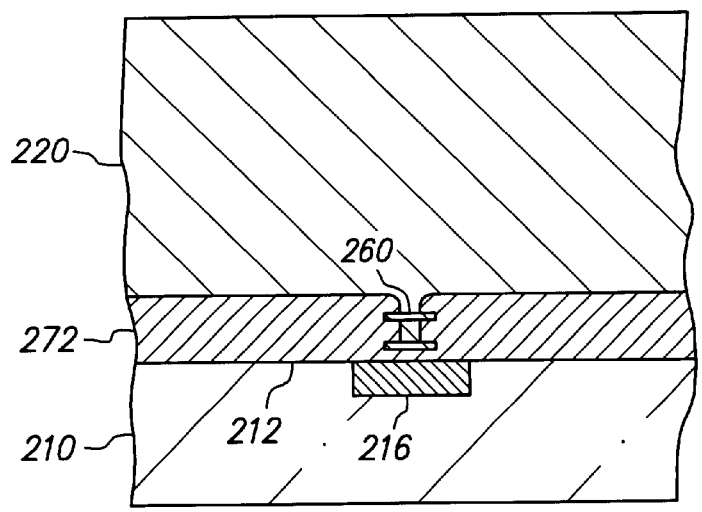
Figure 8I:
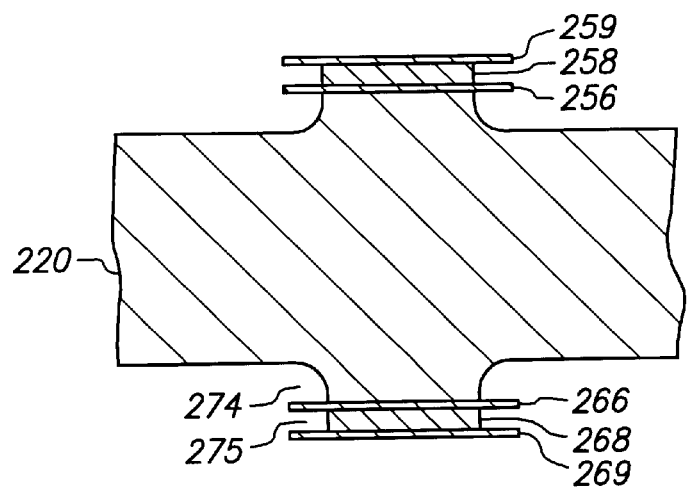
Figure 8J:
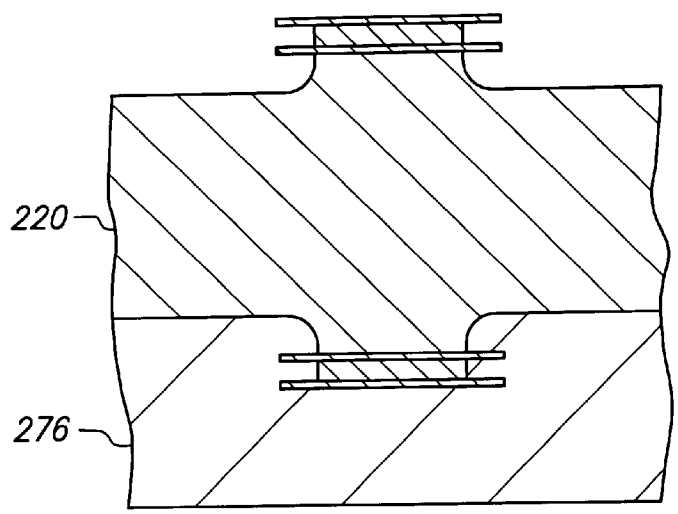
Figure 8K:
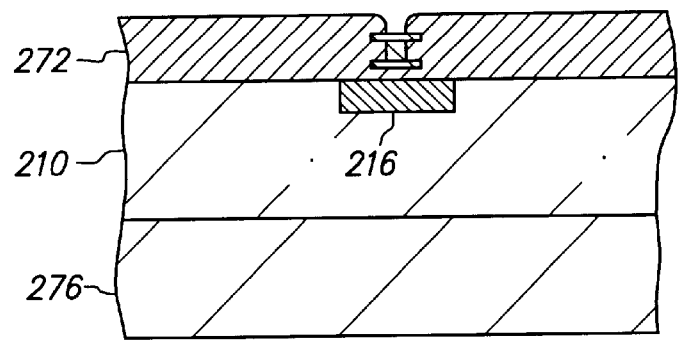
Figure 8L:
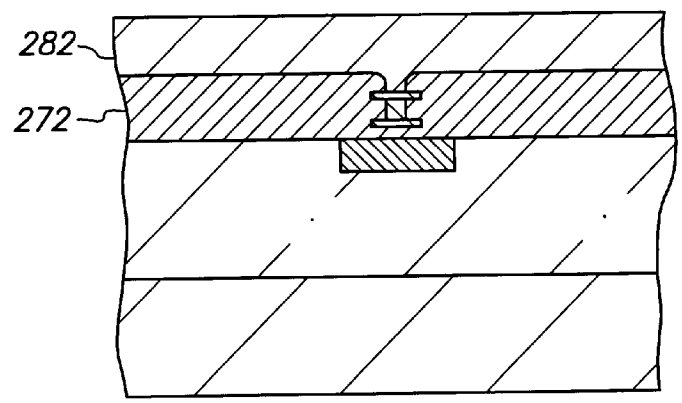
Figure 8M:
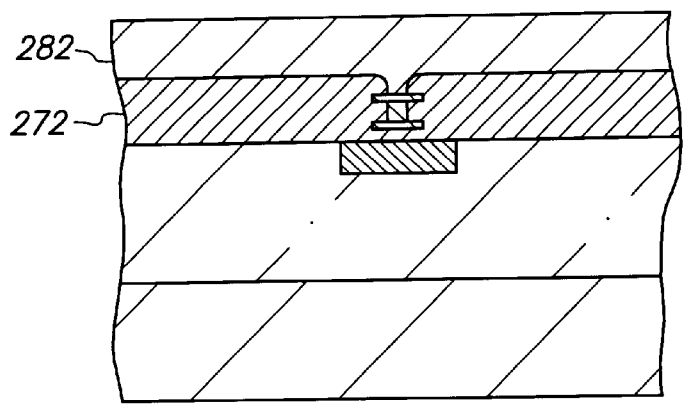
Figure 8N:
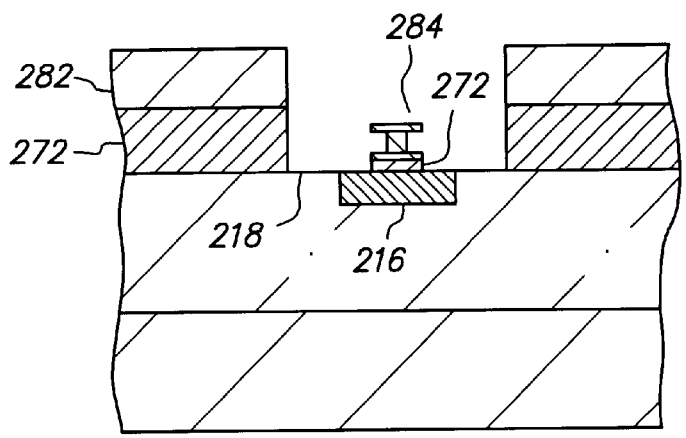
Figure 8O:
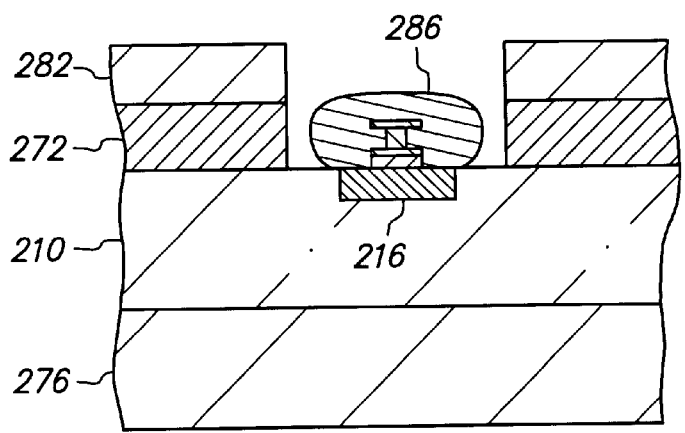

FIGS. 5A–5O, 6A–6O, 7A–7O and 8A–8O are cross-sectional, top, bottom and enlarged cross-sectional views, respectively, of a method of making a semiconductor chip assembly in accordance with a second embodiment of the present invention. FIGS. 8A–8O are oriented orthogonally with respect to FIGS. 5A–5O and depict enlarged views of portions of FIGS. 5A–5O. In the second embodiment, the conductive trace provides fan-out routing for the pad, the routing line extends within and outside a periphery of the chip, and the pillar is disposed outside the periphery of the chip. Furthermore, a channel is formed in the pillar so that the encapsulant interlocks the conductive trace. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, metal base 220 corresponds to metal base 120, etc.

FIGS. 5A, 6A, 7A and 8A are cross-sectional, top, bottom and enlarged cross-sectional views, respectively, of semiconductor chip 210 that includes opposing major surfaces 212 and 214. Surface 212 includes pad 216 and passivation layer 218.

FIGS. 5B, 6B, 7B and 8B are cross-sectional, top, bottom and enlarged cross-sectional views, respectively, of metal base 220 that includes opposing major surfaces 222 and 224.

FIGS. 5C, 6C, 7C and 8C are cross-sectional, top, bottom and enlarged cross-sectional views, respectively, of photoresist layer 230 formed on surface 222 and photoresist layer 240 formed on surface 224. Photoresist layer 230 contains opening 232 that selectively exposes portion 234 of surface 222, and photoresist layer 240 contains opening 242 that selectively exposes portion 244 of surface 224.

FIGS. 5D, 6D, 7D and 8D are cross-sectional, top, bottom and enlarged cross-sectional views, respectively, of metal patterns 250 and 260 formed on metal base 220 by an electroplating operation. Metal pattern 250 includes first and second opposing major surfaces 252 and 254, and metal pattern 260 includes first and second opposing major surfaces 262 and 264. Metal pattern 250 is composed of nickel layer 256 electroplated onto metal base 220, copper layer 258 electroplated onto nickel layer 256, and nickel layer 259 electroplated onto copper layer 258. Metal pattern 260 is composed of nickel layer 266 electroplated onto metal base 220, copper layer 268 electroplated onto nickel layer 266, and nickel layer 269 electroplated onto copper layer 268. Metal pattern 250 includes enlarged rectangular portion 255, and metal pattern 260 includes routing line 263 and enlarged rectangular portion 265. Routing line 263 includes routing portions 263A and 263B.

Metal patterns 250 and 260 are simultaneously formed by an electroplating operation. Metal base 220 is submerged in an electrolytic nickel plating solution so that nickel layers 256 and 266 electroplate on exposed portions 234 and 244 of surfaces 222 and 224, respectively, then the structure is removed from the electrolytic nickel plating solution and submerged in an electrolytic copper plating solution to electroplate copper layers 258 and 268 on nickel layers 256 and 266, respectively, then the structure is removed from the electrolytic copper plating solution and submerged in an electrolytic nickel plating solution to electroplate nickel layers 259 and 269 on copper layers 258 and 268, respectively, and then the structure is removed from the electrolytic copper plating solution and rinsed in distilled water to remove contaminants.

Metal patterns 250 and 260 each have a thickness of 10 microns, nickel layers 256, 259, 266 and 269 each have a thickness of 1 micron, and copper layers 258 and 268 each have a thickness of 8 microns. Routing portion 263A has a width of 30 microns, routing portion 263B (between routing portion 263A and enlarged rectangular portion 265) has a width of 200 microns, and enlarged rectangular portions 255 and 265 each have a width of 300 microns.

FIGS. 5E, 6E, 7E and 8E are cross-sectional, top, bottom and enlarged cross-sectional views, respectively, of metal base 220 and metal patterns 250 and 260 after photoresist layers 230 and 240 are stripped.

FIGS. 5F, 6F, 7F and 8F are cross-sectional, top, bottom and enlarged cross-sectional views, respectively, of metal base 220 and metal patterns 250 and 260 after micro-channels 270 are formed in metal base 220 and micro-channels 271 are formed in metal pattern 260. Micro-channels 270 and 271 are formed by applying a wet chemical etch (or "micro-etch") that is highly selective of copper with respect to nickel, and therefore highly selective of metal base 220 and copper layers 258 and 268 with respect to nickel layers 256, 259, 266 and 269. The micro-etch is relatively brief and removes about 10 microns from the exposed surfaces of metal base 220 and copper layers 258 and 268 without removing an appreciable amount of nickel layers 256, 259, 266 and 269. As a result, the micro-etch laterally undercuts metal base 220 adjacent to the sidewalls of nickel layers 256 and 266 using nickel layers 256 and 266 as etch masks, and laterally undercuts copper layers 258 and 268 adjacent to the sidewalls of nickel layers 256, 259, 266 and 269 using nickel layers 256, 259, 266 and 269 as etch masks. The undercut portions of metal base 220 adjacent to the sidewalls of nickel layer 256 and the undercut portions of copper layer 258 are unimportant. However, the undercut portions of metal base 220 adjacent to the sidewalls of nickel layer 266 form micro-channels 270, and the undercut portions of copper layer 268 form micro-channels 271. Micro-channels 270 and 271 will be useful in interlocking a conductive trace to the assembly as described below.

Micro-channels 270 expose portions of nickel layer 266 that face towards metal base 220 and were previously covered by metal base 220. Similarly, micro-channels 271 expose portions of nickel layers 266 and 269 that face towards one another and were previously covered by copper layer 268. Micro-channels 270 have tapered sidewalls that laterally extend about 10 microns into metal base 220 at exposed portions of nickel layer 266 that face toward metal base 220 and slope outwardly as the vertical distance from nickel layer 266 increases. Micro-channels 271 have vertical sidewalls that laterally extend about 10 microns into metal pattern 260 at exposed portions of nickel layers 266 and 269 that face one another. Furthermore, micro-channels 270 extend across the entire length of nickel layer 266 along the elongated outer edges of nickel layer 266, and micro-channels 271 extend across the entire length of nickel layers 266 and 269 along the elongated outer edges of nickel layers 266 and 269. That is, two micro-channels 270 are each adjacent to opposing elongated outer edges of nickel layer 266 and extend 10 microns into the width of nickel layer 266, and two micro-channels 271 are each adjacent to opposing elongated outer edges of nickel layers 266 and 269 and extend 10 microns into the widths of nickel layers 266 and 269.

At routing portion 263A, which is 30 microns wide, micro-channels 270 are separated from one another by metal base 220 across the remaining 10 micron (30–10–10) width of nickel layer 266, and micro-channels 271 are separated from one another by copper layer 268 across the remaining 10 micron (30–10–10) widths of nickel layers 266 and 269.

Figure 5A:
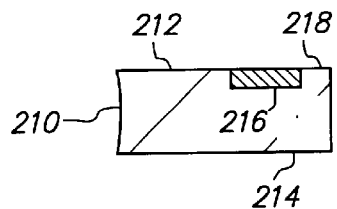
FIGS. 5A–5O are cross-sectional views showing a method of making a semiconductor chip assembly in accordance with a second embodiment of the present invention.
Figure 5B:
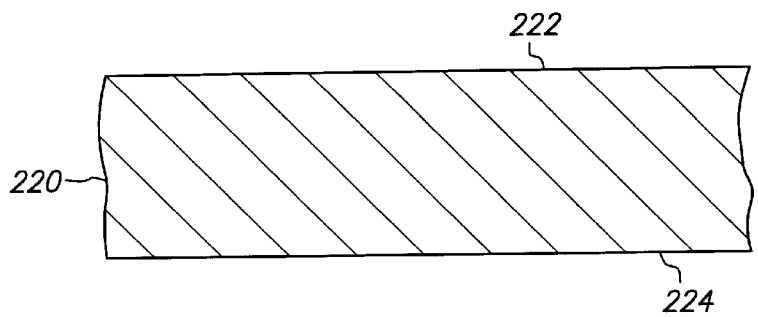
Figure 5C:
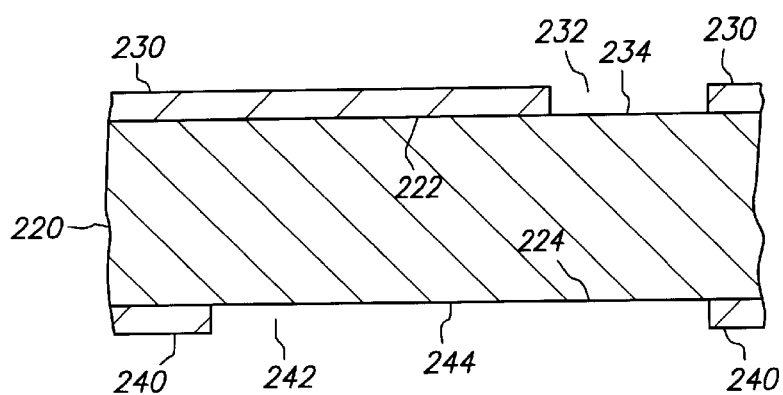
Figure 5D:
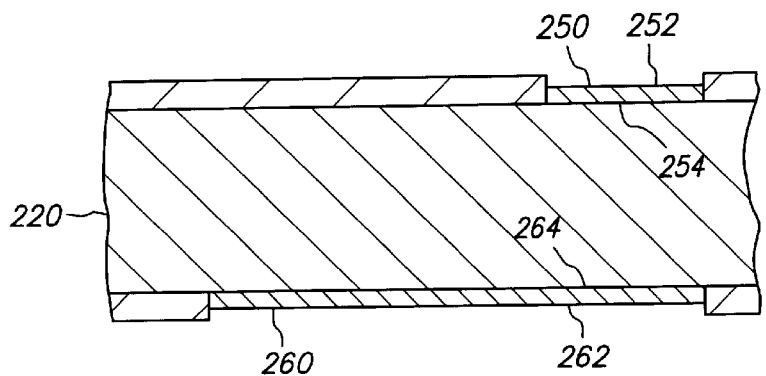
Figure 5E:
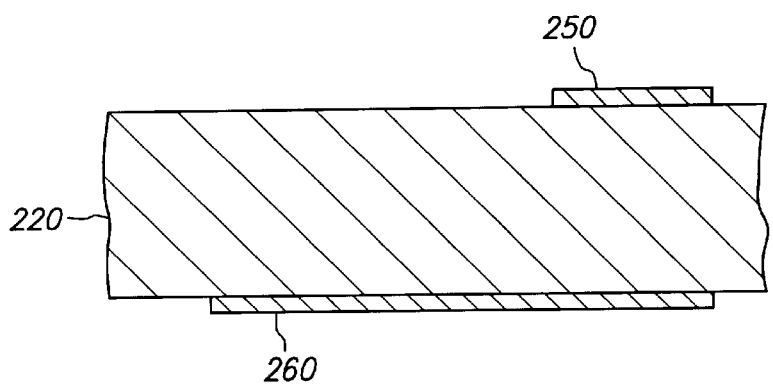
Figure 5F:
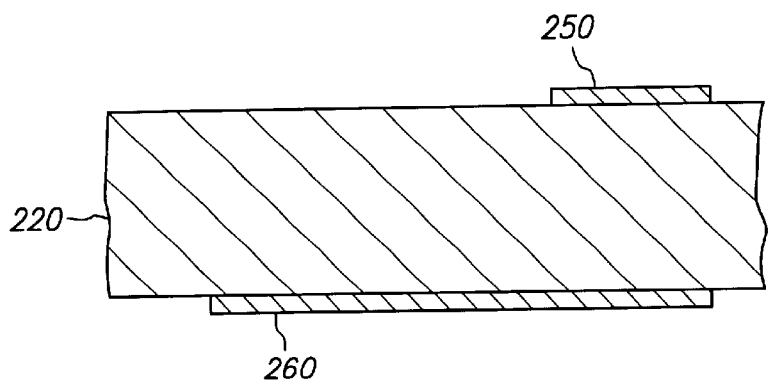
Figure 6F:
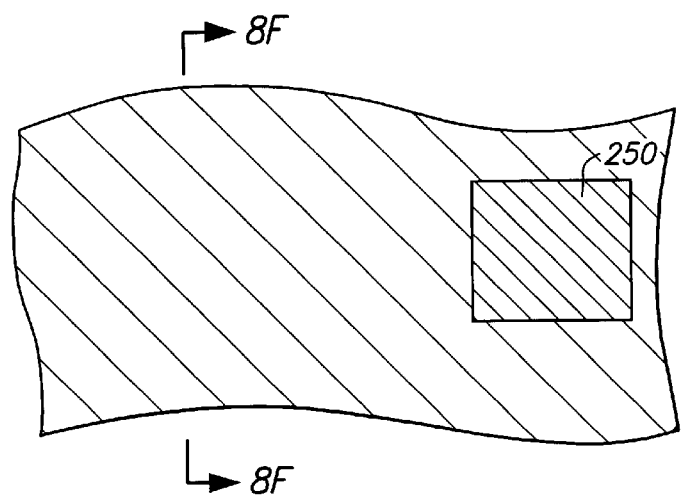
Figure 7F:
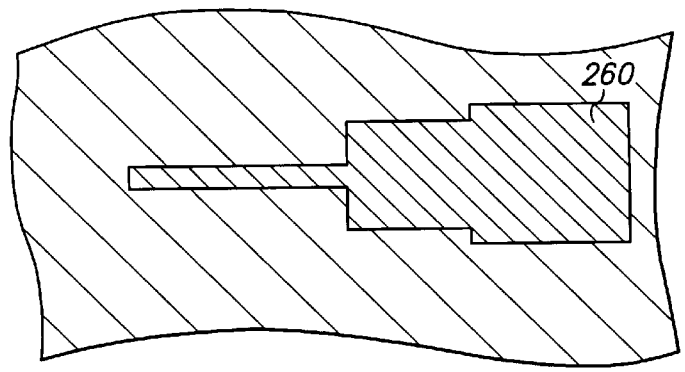
Figure 6G:
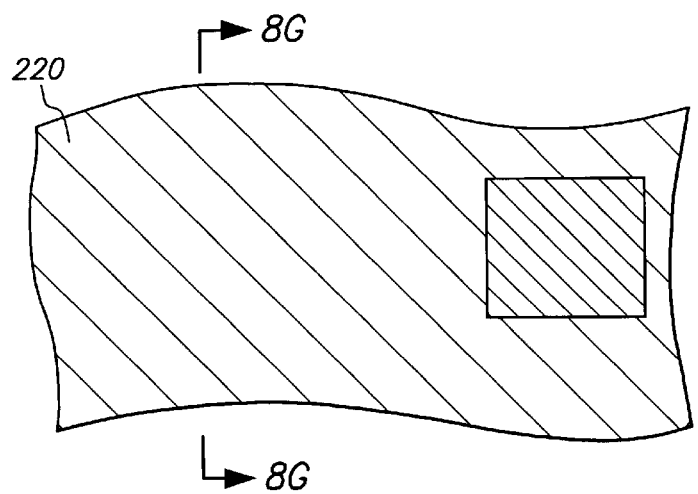
Figure 7G:
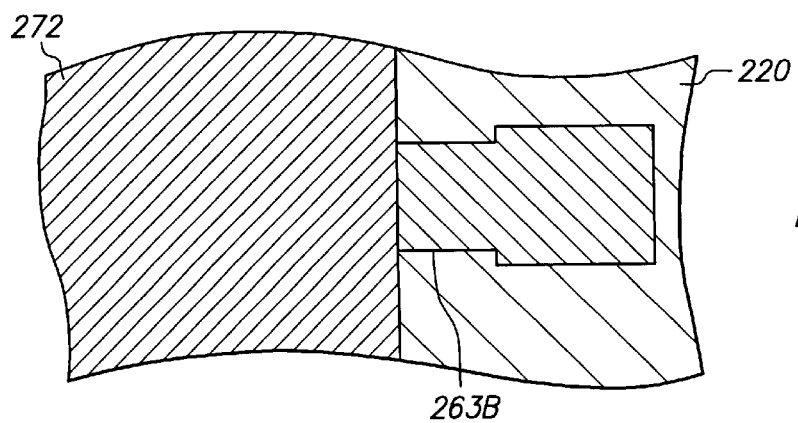
Figure 6H:
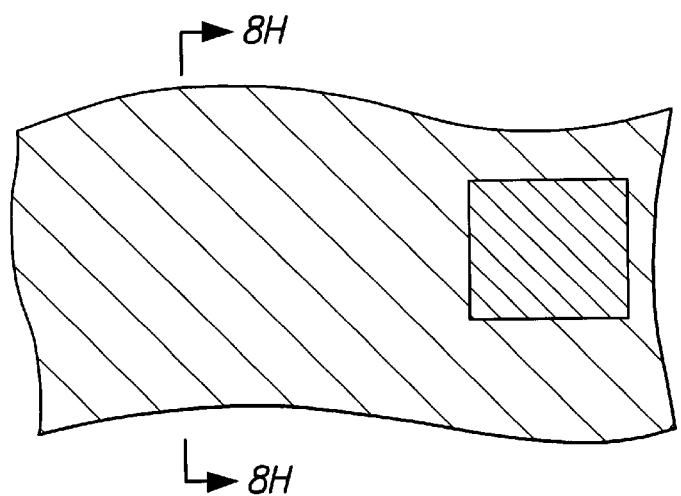
Figure 7H:
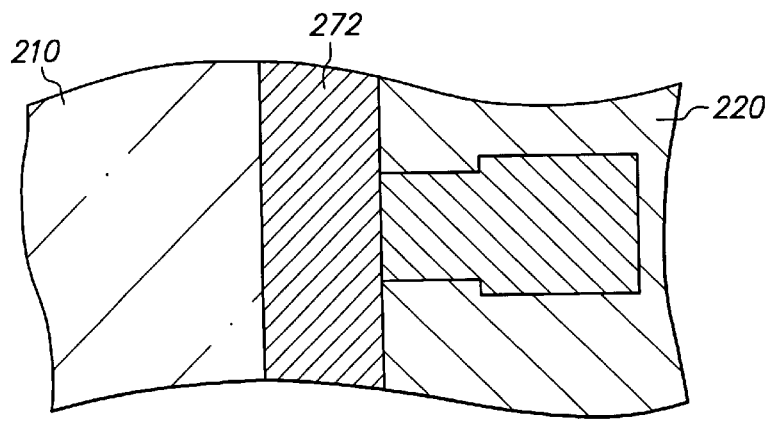

For convenience of illustration, the effects of the micro-etch are shown in FIG. 8F but not in FIGS. 5F, 6F or 7F. In addition, the surfaces of metal base 220 and copper layer 268 before the micro-etch are shown in phantom in FIG. 8F.

FIGS. 5G, 6G, 7G and 8G are cross-sectional, top, bottom and cross-sectional views, respectively, of adhesive 272 formed on metal base 220 and metal pattern 260. A liquid resin is applied over a predetermined portion of the structure using stencil printing and flows over metal base 220 and metal pattern 260 and into micro-channels 270 and 271. The liquid resin also flows over a section routing portion 263B adjacent to routing portion 263A.

FIGS. 5H, 6H, 7H and 8H are cross-sectional, top, bottom and enlarged cross-sectional views, respectively, of chip 210 mechanically attached to metal base 220 and metal pattern 260 by adhesive 272.

Chip 210 and metal base 220 are positioned relative to one another so that chip 210 is disposed and centered within the surface area of adhesive 272, routing line 263 is disposed above and overlaps and is electrically isolated from pad 216, routing portion 263A extends across the outer edge of chip 210 near pad 216, and routing portion 263B and enlarged rectangular portions 255 and 265 are disposed outside the periphery of chip 210. Adhesive 272 is fully cured to form a solid adhesive electrically insulative polyimide layer that mechanically fastens chip 210 to metal base 220 and metal pattern 260. Adhesive 272 is sandwiched between surface 212 and surface 224, and between surface 212 and surface 262, completely covers routing portion 263A, and extends 50 microns beyond routing portion 263A in the direction away from chip 210 into routing portion 263B. Moreover, adhesive 272 extends into micro-channels 270 and 271, thereby interlocking metal pattern 260 to adhesive 272 and enhancing the mechanical attachment between metal pattern 260 and adhesive 272.

FIGS. 5I, 6I, 7I and 8I are cross-sectional, top, bottom and enlarged cross-sectional views, respectively, of the structure after channel 274 is formed in metal base 220 and channel 275 is formed in metal pattern 260. Channels 274 and 275 are formed by applying a wet chemical etch to the structure that is highly selective of copper with respect to nickel and polyimide, and therefore, highly selective of metal base 220 and copper layers 258 and 268 with respect to nickel layers 256, 259, 266 and 269 and adhesive 272. The wet chemical etch removes about 30 microns from the exposed surfaces of metal base 220 and copper layers 258 and 268 without removing an appreciable amount of nickel layers 256, 259, 266 and 269 or adhesive 272. In addition, adhesive 272 protects routing portion 263A from the etch. As a result, the etch laterally undercuts metal base 220 using nickel layers 256 and 266 as etch masks, and laterally undercuts copper layers 258 and 268 using nickel layers 256, 259, 266 and 269 as etch masks. This increases the undercut provided by the micro-etch. The undercut portions of metal base 220 adjacent to the nickel layer 256 and the undercut portions of copper layer 258 are unimportant. However, the undercut portions of metal base 220 adjacent to nickel layer 266 form channels 274, and the undercut portions of copper layer 268 adjacent to nickel layers 266 and 269 form channels 275. Channels 274 and. 275 will be useful in interlocking a conductive trace to the assembly as described below.

Channels 274 enlarge micro-channels 270 and expose portions of nickel layer 266 that face towards metal base 220 and were previously covered by metal base 220. Similarly, channels 275 enlarge micro-channels 271 and expose portions of nickel layers 266 and 269 that face towards one another and were previously covered by copper layer 268. Channels 274 have tapered sidewalls that laterally extend about 40 microns into metal base 220 at exposed portions of nickel layer 266 that face toward metal base 220 and slope outwardly as the vertical distance from nickel layer 266 increases. Channels 275 have vertical sidewalls that laterally extend about 40 microns into metal pattern 260 at exposed portions of nickel layers 266 and 269 that face one another. Furthermore, channels 274 extend across the length of nickel layer 266 outside adhesive 272, and channels 275 extend across the length of nickel layers 266 and 269 outside adhesive 272.

A suitable wet chemical etch can be provided by the same solution used for the micro-etch. The optimal etch time for exposing the structure to the wet chemical etch in order to form channels 274 and 275 with the desired dimensions can be established through trial and error.

Figure 5G:
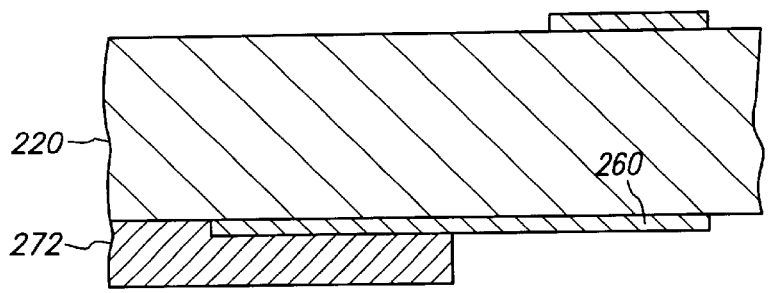
Figure 5H:
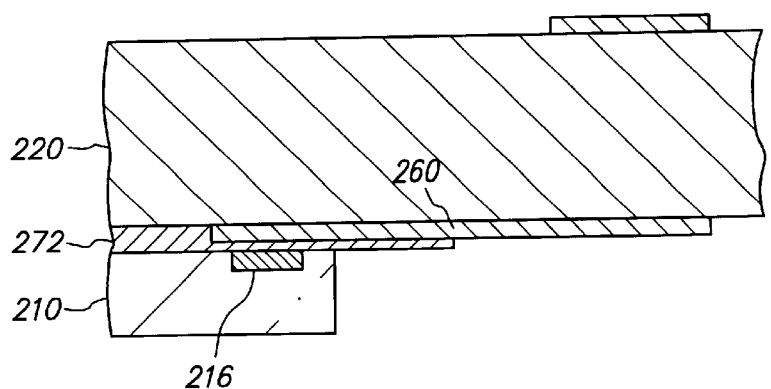
Figure 5I:
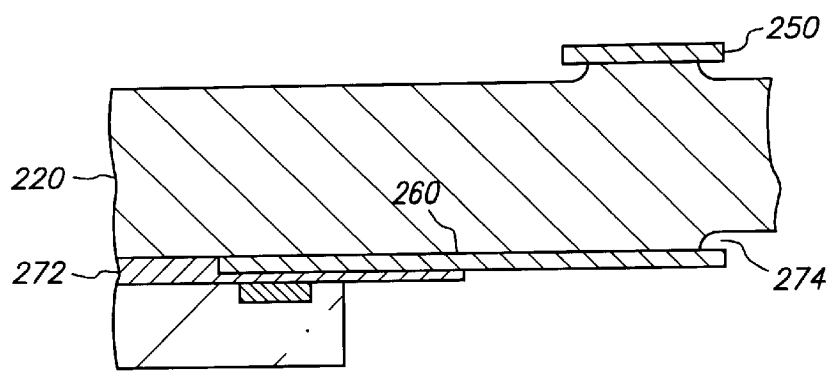
Figure 6I:
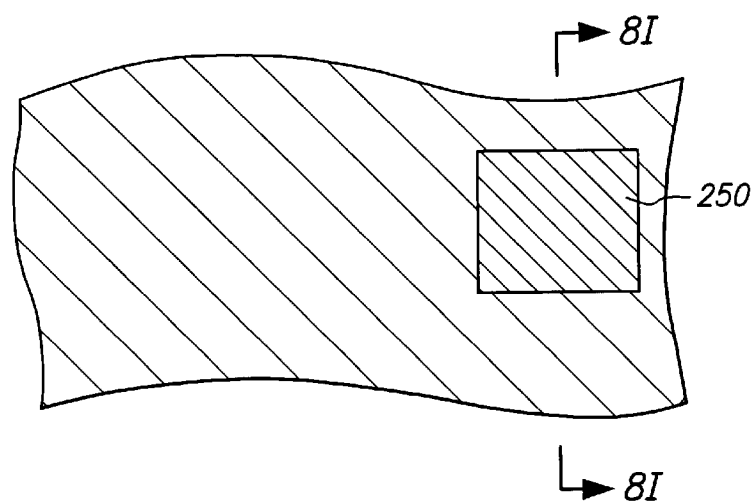
Figure 7I:
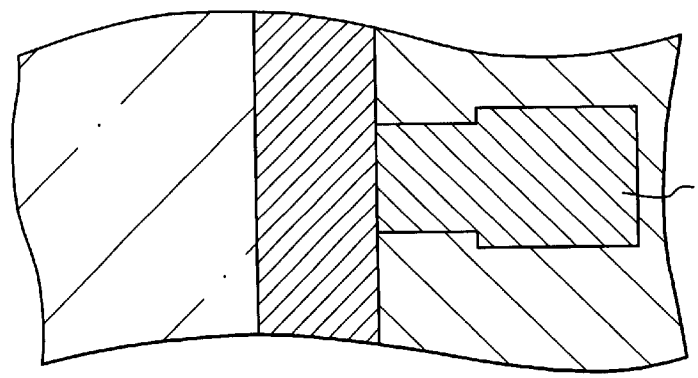
Figure 5J:
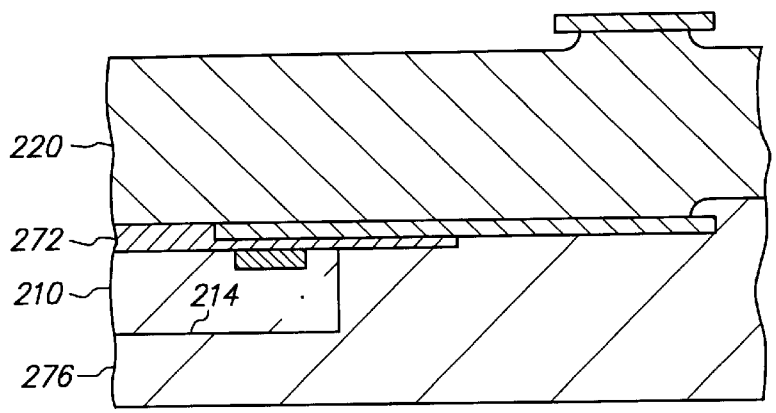
Figure 6J:
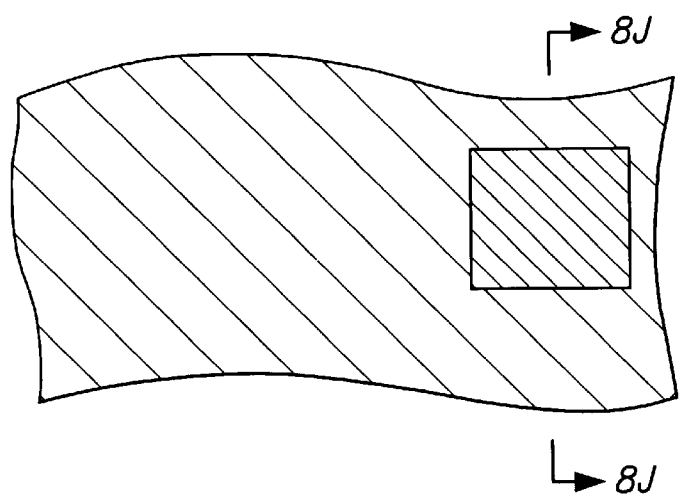
Figure 7J:
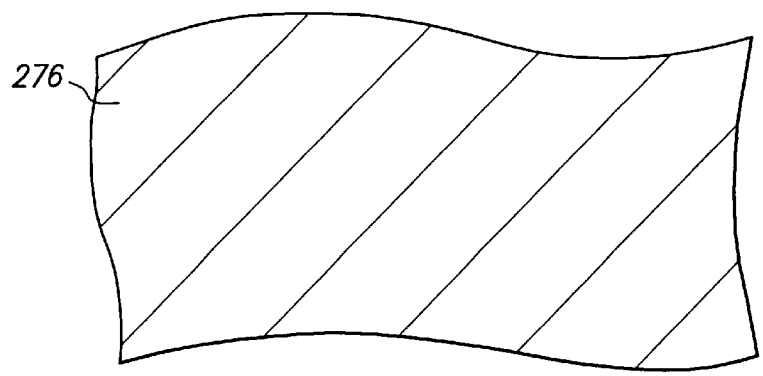
Figure 5K:
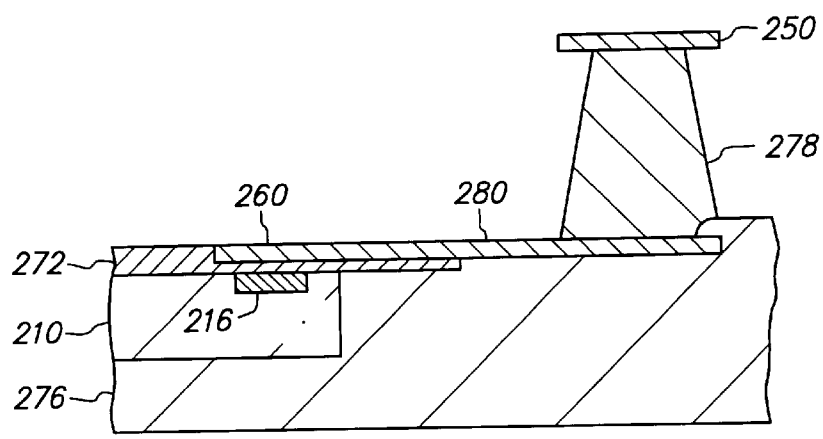
Figure 6K:
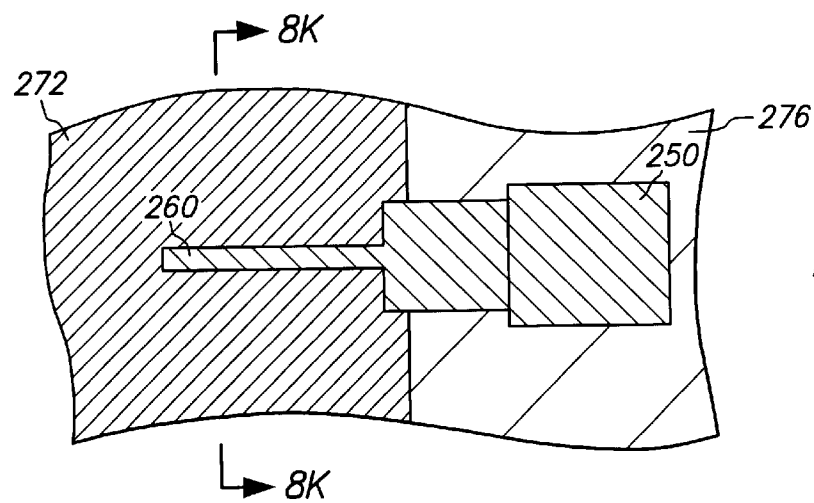
Figure 7K:
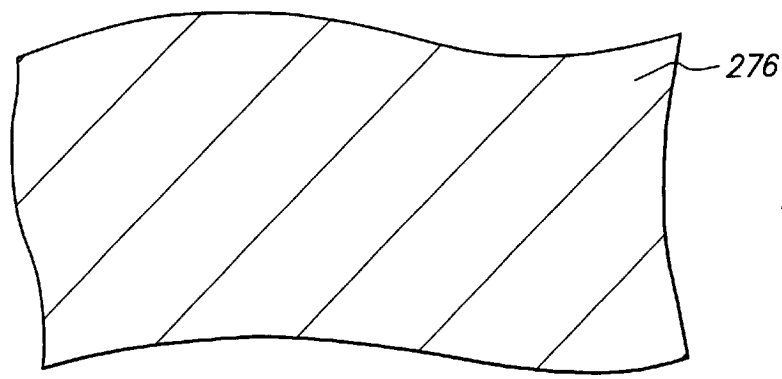
Figure 5L:
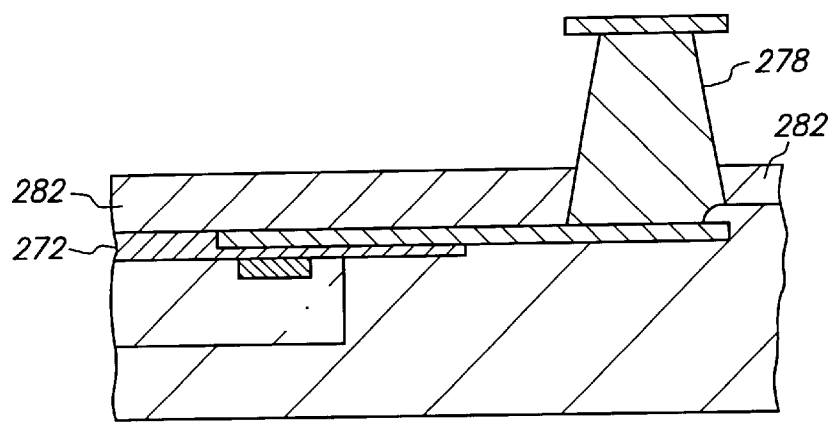
Figure 6L:
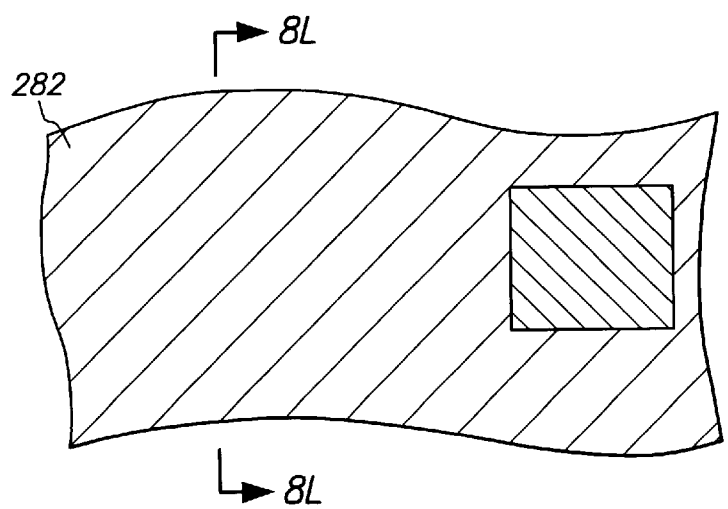
Figure 7L:
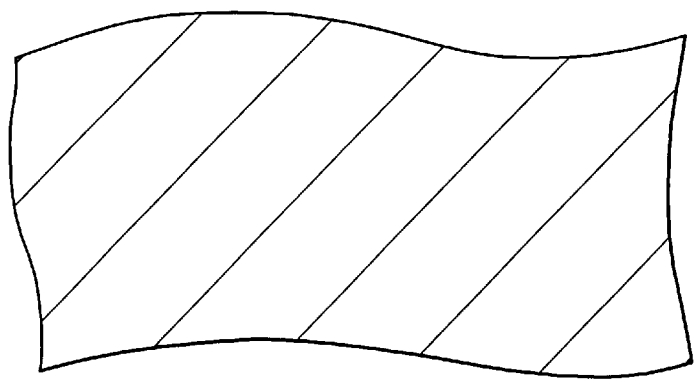
Figure 5M:
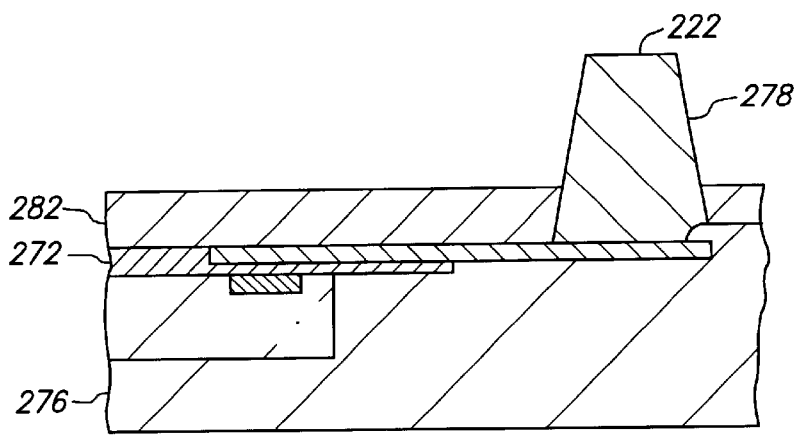
Figure 6M:
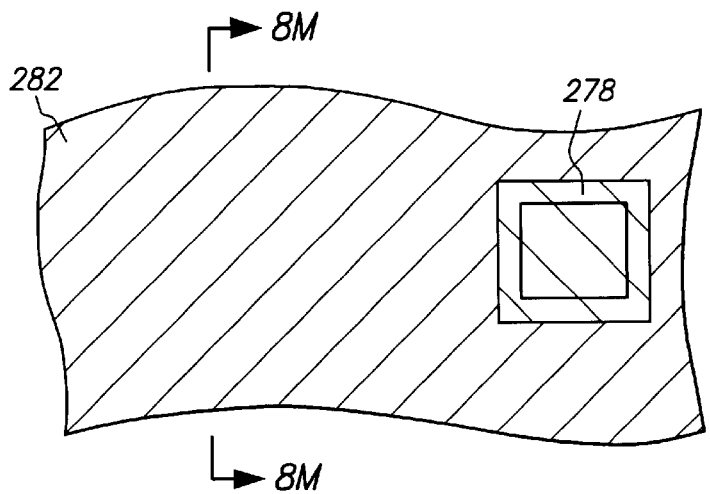
Figure 7M:
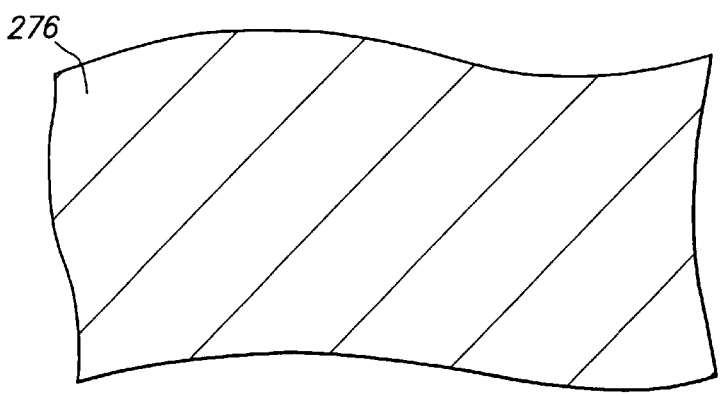
Figure 5N:
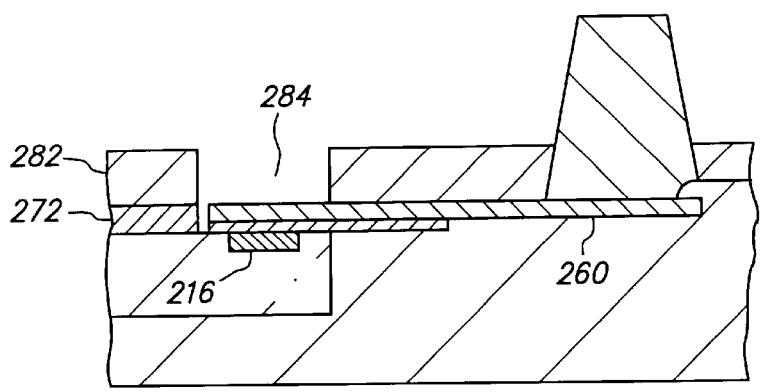
Figure 6N:
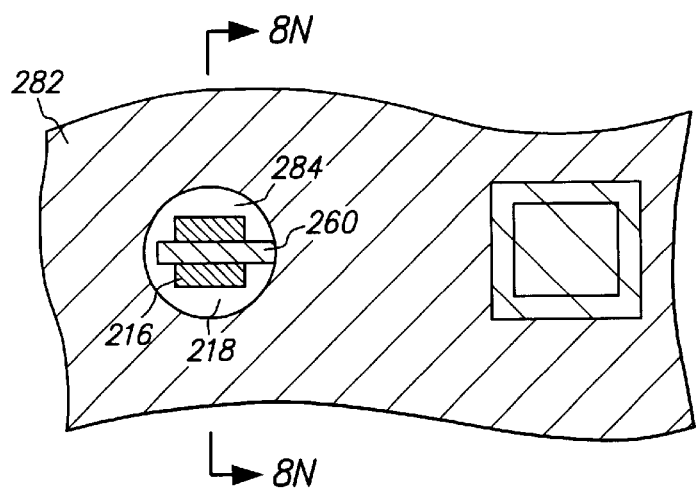
Figure 7N:
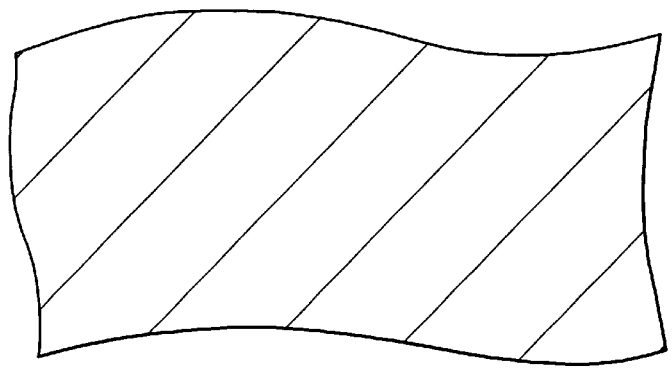
Figure 5O:
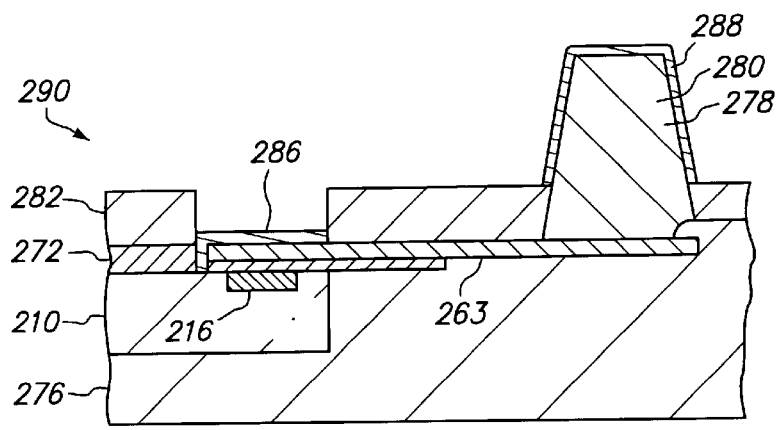
Figure 6O:
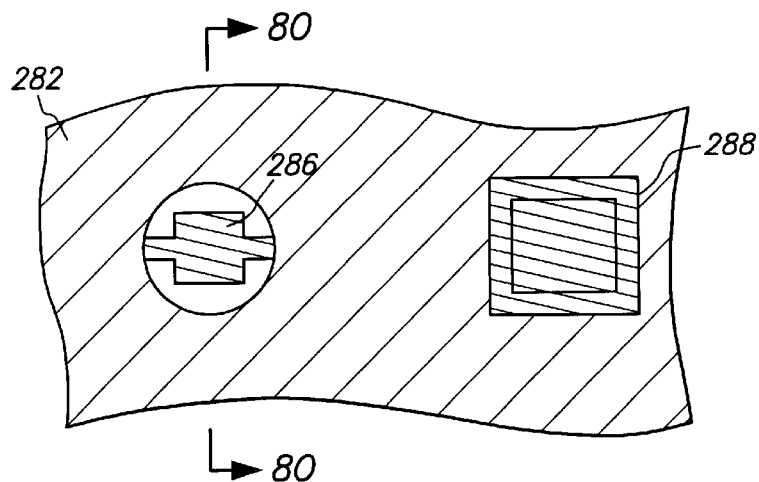
Figure 7O:
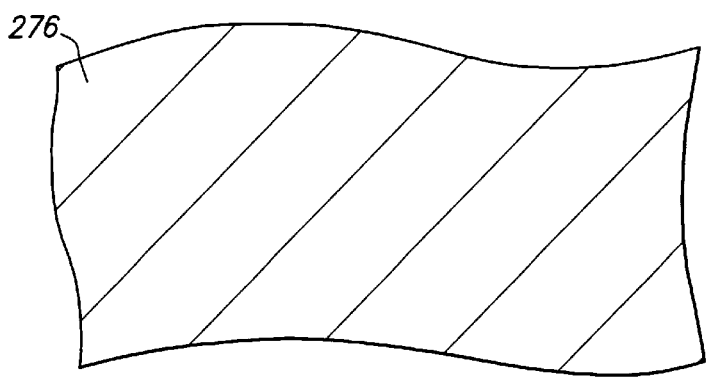

For convenience of illustration, metal patterns 250 and 260 continue to be shown as single layers in FIG. 5I. Therefore, channel 274 is shown in FIGS. 5I and 8I, and channels 274 and 275 are shown in FIG. 8I.

FIGS. 5J, 6J, 7J and 8J are cross-sectional, top, bottom and enlarged cross-sectional views, respectively, of encapsulant 276 formed on chip 210, metal base 220, metal pattern 260 and adhesive 272 by transfer molding. Encapsulant 276 contacts surface 214 of chip 210, the outer edges of chip 210, the surface of adhesive 272 that faces towards and is outside the periphery of chip 210, and the surfaces of metal base 220 and metal pattern 260 that face towards chip 210 and are outside the periphery of adhesive 272 without contacting surface 222 or metal pattern 250. Moreover, encapsulant 276 extends into and fills channels 274 and 275, thereby interlocking metal pattern 260 to encapsulant 276 and enhancing the mechanical attachment between metal pattern 260 and encapsulant 276.

Encapsulant 276 is a solid adherent compressible protective layer that provides back-side environmental protection such as moisture resistance and particle protection for chip 210 as well as mechanical support for metal base 220, metal pattern 260 and adhesive 272 outside the periphery of chip 210.

FIGS. 5K, 6K, 7K and 8K are cross-sectional, top, bottom and enlarged cross-sectional views, respectively, of the structure after a portion of metal base 220 within the periphery of chip 210 is removed and a remaining portion of metal base 220 outside the periphery of chip 210 remains to form pillar 278. This is accomplished by applying a wet chemical etch using nickel layer 256 as an etch mask. The wet chemical etch is highly selective of copper with respect to nickel, polyimide and the molding compound, and therefore, highly selective of metal base 220 with respect to nickel layers 256 and 266, adhesive 272 and encapsulant 276. Therefore, no appreciable amount of nickel layer 256, nickel layer 266, adhesive 272 or encapsulant 276 is removed. Nickel layer 266 protects the underlying copper layer 268 from the etch. The wet chemical etch further undercuts copper layer 258, however this is unimportant since copper layer 258 will be subsequently removed. For convenience of illustration, metal pattern 250 is shown as a single layer in FIG. 5K and the undercut in copper layer 258 is not shown in FIG. 5K.

Metal pattern 260 and pillar 278 in combination provide conductive trace 280 that is adapted for providing horizontal and vertical routing between pad 216 and a terminal on a printed circuit board (not shown) in a next level assembly.

A suitable wet chemical etch can be provided by the same solution used for the micro-etch. The optimal etch time for exposing the structure to the wet chemical etch in order to completely remove metal base 220 within the periphery of chip 210 and form pillar 278 with the desired dimensions can be established through trial and error.

At this stage, adhesive 272 continues to cover pad 216, and adhesive 272 and encapsulant 276 provide mechanical support for metal pattern 260. The portions of adhesive 272 that extend into micro-channels 270 and 271 provide elongated flanges, thereby interlocking metal pattern 260 to adhesive 272 and enhancing the mechanical attachment between metal pattern 260 and adhesive 272. Likewise, the portions of encapsulant 276 that extend into channels 274 and 275 provide elongated flanges, thereby interlocking metal pattern 260 to encapsulant 276 and enhancing the mechanical attachment between metal pattern 260 and encapsulant 276. The enhanced mechanical strength is particularly useful after the portion of metal base 220 within the periphery of chip 210 is removed. Furthermore, the compressibility of encapsulant 276 permits pillar 278 to provide a compressible, compliant contact terminal. That is, pillar 278 exhibits elastic deformation in response to vertically oriented external pressure applied to pillar 278 in the direction from top surface 222 towards surface 224. As a result, pillar 278 provides excellent vertical compliance for the next level assembly.

FIGS. 5L, 6L, 7L and 8L are cross-sectional, top, bottom and enlarged cross-sectional views, respectively, of insulative base 282 formed on metal pattern 260, adhesive 272 encapsulant 276 and pillar 278.

FIGS. 5M, 6M, 7M and 8M are cross-sectional, top, bottom and enlarged cross-sectional views, respectively, of the structure after metal pattern 250 is removed using a nickel etching solution that is highly selective of nickel with respect to polyimide, epoxy and the molding compound. A suitable nickel etching solution is a dilute mixture of nitric and hydrochloric acid. Since nickel layers 256 and 259 are extremely thin relative to pillar 278, and the structure is removed from the nickel etching solution immediately after nickel layers 256 and 259 are stripped, it is not critical that the nickel etching solution be highly selective of nickel with respect to copper. In fact, the nickel etching solution can be selective of copper so that after nickel layer 259 is removed copper layer 258 is fully exposed, and after copper layer 258 is removed nickel layer 256 is fully exposed. Since the structure is rapidly removed from the nickel etching solution after nickel layer 256 is stripped, and pillar 278 is large relative to nickel layers 256 and 259 and copper layer 258, the nickel etching solution has no significant impact on pillar 278. Furthermore, insulative base 282 protects nickel layer 266 from the nickel etching solution. Therefore, no appreciable amount of metal pattern 260, adhesive 272, encapsulant 276, pillar 278 or insulative base 282 is removed. Stripping metal pattern 250 exposes pillar 278 at surface 222.

FIGS. 5N, 6N, 7N and 8N are cross-sectional, top, bottom and enlarged cross-sectional views, respectively, of opening 284 in adhesive 272 and insulative base 282 that exposes pad 216 and metal pattern 260.

FIGS. 5O, 6O, 7O and 8O are cross-sectional, top, bottom and enlarged cross-sectional views, respectively, of connection joint 286 formed on pad 216 and routing line 263, and contact terminal 288 formed on pillar 278, by electroless plating.

At this stage, the manufacture of semiconductor chip assembly 290 that includes chip 210, adhesive 272, encapsulant 276, conductive trace 280, insulative base 282, connection joint 286 and contact terminal 288 can be considered complete. Conductive trace 280 is mechanically coupled to chip 210 by adhesive 272 and encapsulant 276, and is electrically coupled to chip 210 by connection joint 286. Conductive trace 280 extends beyond an outer edge of chip 210 and provides horizontal fan-out routing (via metal pattern 260) and vertical routing (via pillar 278) between pad 216 and external circuitry. Encapsulant 276 and insulative base 282 provide mechanical support and environmental protection for the assembly. Moreover, adhesive 272 interlocks conductive trace 280 to chip 210 using flange portions in micro-channels 270 and 271, and encapsulant 276 interlocks conductive trace 280 to chip 210 using flange portions in channels 274 and 275.

The semiconductor chip assemblies described above are merely exemplary. Numerous other embodiments are contemplated. For instance, various features such as the encapsulant, the insulative base and the contact terminal may be omitted. Likewise, various features of the first and second embodiments can be combined with one another.

Figure 9:
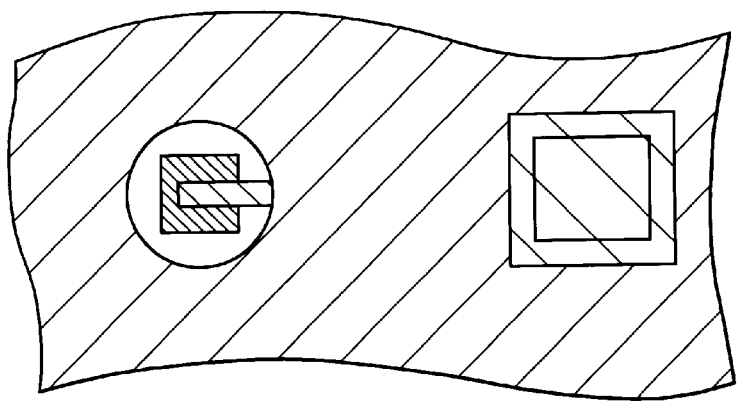
FIGS. 9–13 are top plan views of routing line variations in accordance with the present invention.
Figure 10:
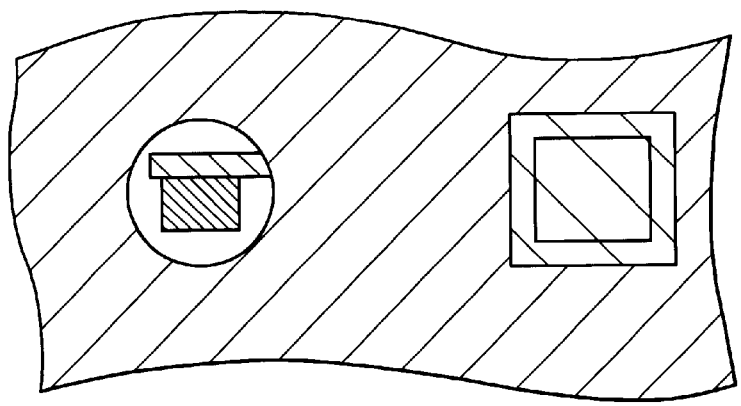
Figure 11:
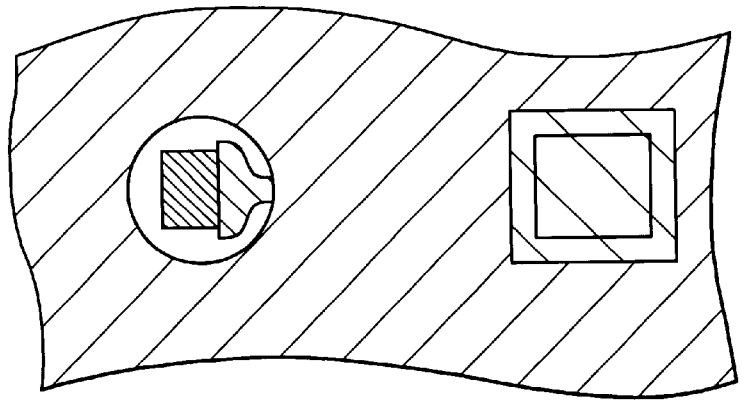
Figure 12:
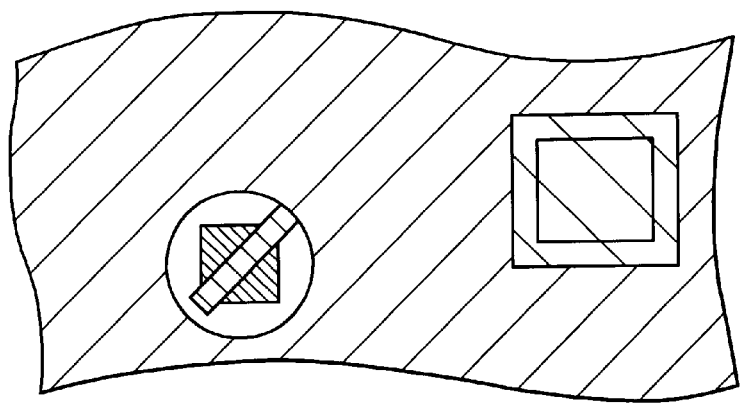
Figure 13:
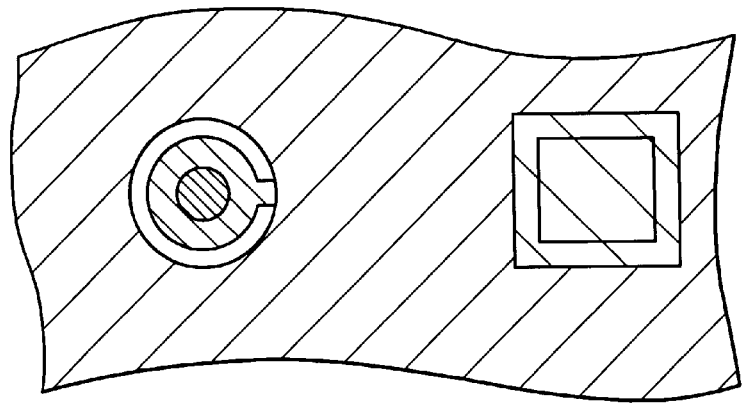

The conductive trace can have various shapes and sizes. The conductive trace can overlap various portions of the pad, such as two opposing peripheral edges and the center of the pad (FIGS. 2M and 6N), one peripheral edge and the center of the pad (FIG. 9), three peripheral edges but not the center of the pad (FIGS. 10 and 11), two corners and the center of the pad (FIG. 12) or four peripheral edges but not the center of the pad (FIG. 13).

The conductive trace can be various conductive metals including copper, gold, nickel, aluminum, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The metal patterns can be formed on the metal base by numerous deposition techniques including electroplating and electroless plating.

The metal patterns can be deposited as a single layer or multiple layers. If desired, the metal pattern proximate to the pad can be spot plated near the pad to make i compatible with receiving the connection joint. For instance, a copper conductive trace can be spot plated with nickel and then silver to make it compatible with a gold ball bond connection joint and avoid the formation of brittle silver-copper intermetallic compounds.

As another example, the metal patterns can include a non-copper layer electroplated on a copper base and a copper layer electroplated on the non-copper layer. Suitable non-copper layers include nickel, gold, palladium and silver. Furthermore, it is understood that in the context of the present invention, the metal patterns and the metal base are different metals (or metallic materials) even if a multi-layer metal pattern includes a single layer that is similar to the metal base (such as the example described above).

The metal pattern on the surface of the metal base opposite the chip need not necessarily be stripped, and can remain a portion of the conductive trace.

The conductive trace may function as a signal, power or ground layer depending on the purpose of the associated chip pad. The conductive trace need not necessarily extend above the top surface of the insulative base, and a ball, a pad, or a pillar (columnar post) can be deposited on the conductive trace or be a top portion of the conductive trace. A pillar is particularly well-suited for reducing thermal mismatch related stress in the next level assembly. A pillar can be formed in numerous manners, including additive and subtractive techniques. Likewise, the conductive trace can fan-in or fan-out or both, regardless of whether it includes a pillar.

The metal base can be various metals including copper, copper alloys, iron-nickel alloys, aluminum, and so on.

The pad can have numerous shapes including a flat rectangular shape and a bumped shape. For instance, a bump-shaped pad may extend into the opening in the adhesive and may even extend above the conductive trace. The pad can either be partially or completely exposed prior to forming the connection joint. The pad can have a length and width that are larger than, equal to, or smaller than the diameter of the opening in the adhesive. Preferably, the pad and opening have the same or similar size, and a substantial portion of the pad is directly beneath the opening.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. The insulative base can be deposited on the routing line but not the pillar, or alternatively, deposited on the routing line and the pillar and then etched back so that a top portion of the pillar is exposed.

Numerous adhesives can be applied between the chip and the conductive trace. For instance, the adhesive can be applied as a paste, a laminated layer, or a liquid applied by screen-printing, spin-on, or spray-on. If a paste or liquid adhesive, is applied, the adhesive may contact the metal base, whereas if a laminated adhesive is applied then no appreciable amount of adhesive may contact the metal base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Furthermore, the opening in the adhesive may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the opening in the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the opening in the adhesive.

Numerous etches can be applied to form the opening in the adhesive. For instance, the opening in the adhesive can be formed by laser direct write (without a mask) or a blanket plasma etch that removes portions of the adhesive not covered by the conductive trace.

The encapsulant can be deposited on the chip using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip.

A wide variety of interlocking features can be employed. For instance, the adhesive can extend into a channel in the metal pattern, or a channel in the metal base adjacent to the metal pattern, or both, or neither. Likewise, the encapsulant can extend into a channel in the metal pattern, or a channel in the metal base adjacent to the metal pattern, or both, or neither.

For example, if the metal pattern consists of a single nickel layer then a channel can be formed in the metal base but not the metal pattern. As another example, if the metal pattern consists of a tri-layer and the middle layer has a different composition than the metal base, then a channel can be formed in the metal base but not the metal pattern by applying a wet chemical etch that is selective of the metal base with respect to the tri-layer, or alternatively, a channel can be formed in the metal pattern but not the metal base by applying a wet chemical etch that is selective of the middle layer with respect to the metal base and the outer layers. As a further example, if the metal pattern consists of a tri-layer and the middle layer has a similar composition to the metal base, then a channel can be formed in the metal pattern but not the metal base by applying a wet chemical etch that does not remove the metal base across the thickness of the outer layer of the metal pattern adjacent to the metal base.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joint depends on design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

After the connection joint is formed, further encapsulation can be performed but is generally not necessary. However, it may be desirable to provide further encapsulation to enhance the mechanical strength of the assembly in the event the encapsulant and/or insulative base are particularly thin or omitted.

After the connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted. Likewise, the metal base is shown above the routing line that is shown above the chip with a single orientation throughout the drawings for ease of comparison between the figures, although the assembly and its components may be inverted at various manufacturing stages.

Advantageously, the semiconductor, chip assembly of the present invention is reliable and inexpensive. The adhesive and the encapsulant include flanges that interlock the conductive trace to the assembly. The insulative base and the encapsulant protect the chip from handling damage and provide a known dielectric barrier for the conductive trace. The insulative base prevents solder reflow at the pillar from contacting or electrically shorting the underlying routing line. The pillar yields enhanced reliability for the next level assembly that exceeds that of conventional BGA packages. The mode of the connection shifts from the initial mechanical coupling to metallurgical coupling to assure sufficient metallurgical bond strength. Furthermore, the conductive trace can be mechanically and metallurgically coupled to the chip without wire bonding, TAB or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of making a semiconductor chip assembly, comprising:
    attaching a semiconductor chip to a metallic structure using an insulative adhesive, wherein the chip includes a conductive pad, and the metallic structure includes a metal base, a first metal pattern and a second metal pattern, the first metal pattern is disposed on a side of the metal base that faces away from the chip, and the second metal pattern is disposed on a side of the metal base that faces towards the chip; then
    etching the metal base, thereby exposing the second metal pattern; and then
    forming a connection joint that contacts and electrically connects the second metal pattern and the pad.

2. The method of claim 1, wherein the first metal pattern is disposed within a periphery of the chip and does not overlap the pad, the second metal pattern is disposed within the periphery of the chip and overlaps the pad, and etching the metal base includes removing all of the metal base within a periphery of the pad without removing a portion of the metal base within the periphery of the chip.

3. The method of claim 1, wherein the first metal pattern is disposed outside a periphery of the chip, the second metal pattern extends within and outside the periphery of the chip and overlaps the pad, and etching the metal base includes removing all of the metal base within the periphery of the chip without removing a portion of the metal base outside the periphery of the chip.

4. The method of claim 1, including etching the adhesive thereby exposing the pad after etching the metal base and before forming the connection joint.

5. The method of claim 4, wherein the adhesive contacts and is sandwiched between the metallic structure and the pad, and the metallic structure and the pad are electrically isolated from one another after etching the adhesive and before forming the connection joint.

6. The method of claim 1, including electroplating the first and second metal patterns on the metal base before attaching the chip to the metallic structure.

7. The method of claim 1, including:
    etching the metal base using the second metal pattern as an etch mask, thereby forming an undercut channel in the metal base that exposes a portion of the second metal pattern that faces away from the chip and towards the metal base; and then
    filling the adhesive into the undercut channel, thereby contacting the adhesive to the portion of the second metal pattern.

8. The method of claim 1, including:
    etching the metal base using the second metal pattern as an etch mask after attaching the chip to the metallic structure using the adhesive, thereby forming an undercut channel in the metal base that exposes a portion of the second metal pattern that faces away from the chip and towards the metal base; and then
    filling an encapsulant into the undercut channel, thereby contacting the encapsulant to the portion of the second metal pattern.

9. The method of claim 1, wherein the metallic structure consists of the metal base, the first metal pattern and the second metal pattern, the metal base consists of copper, the first metal pattern includes a nickel layer and a copper layer, the second metal pattern includes a nickel layer and a copper layer, the nickel layers contact the metal base and the copper layers are separated from the metal base.

10. The method of claim 1, wherein the assembly is devoid of wire bonds, TAB leads and solder joints.

11. A method of making a semiconductor chip assembly, comprising:
    providing a semiconductor chip that includes a conductive pad;
    providing a metal base with first and second surfaces that are opposite one another;
    forming a first metal pattern on the first surface of the metal base, wherein the first metal pattern includes a first metal layer that contacts the first surface of the metal base and has a different composition than the first surface of the metal base;
    forming a second metal pattern on the second surface of the metal base, wherein the second metal pattern includes a second metal layer that contacts the second surface of the metal base and has a different composition than the second surface of the metal base;
    disposing an insulative adhesive between the chip and the second metal pattern, thereby mechanically attaching the chip to the second metal pattern, wherein the first surface of the metal base faces away from the chip and the second surface of the metal base faces towards the chip; then
    etching the metal base, thereby exposing the second metal pattern; then
    etching the adhesive, thereby exposing the pad; and then
    forming a connection joint that contacts and electrically connects the second metal pattern and the pad.

12. The method of claim 11, wherein forming the first and second metal patterns on the metal base includes simultaneously electroplating the first and second metal patterns on the metal base.

13. The method of claim 11, wherein disposing the adhesive includes contacting the adhesive to the chip and the second metal pattern and then curing the adhesive.

14. The method of claim 11, wherein etching the metal base includes applying a wet chemical etchant to the metal base using the first metal pattern as an etch mask.

15. The method of claim 11, wherein etching the adhesive includes applying a laser to the adhesive using the second metal pattern as an etch mask.

16. The method of claim 11, wherein forming the connection joint includes plating a metal on the second metal pattern and the pad.

17. The method of claim 11, including:
etching the metal base using the second metal pattern as an etch mask, thereby forming an undercut channel in the metal base that exposes a portion of the second metal pattern that faces away from the chip and towards the second surface of the metal base; and then
filling the adhesive into the undercut channel, thereby contacting the adhesive to the portion of the second metal pattern.

18. The method of claim 11, including:
etching the metal base using the second metal pattern as an etch mask after disposing the adhesive, thereby forming an undercut channel in the metal base that exposes a portion of the second metal pattern that faces away from the chip and towards the second surface of the metal base; and then
filling an encapsulant into the undercut channel, thereby contacting the encapsulant to the portion of the second metal pattern.

19. The method of claim 18, wherein filling the encapsulant includes transfer molding the encapsulant.

20. The method of claim 11, including forming an insulative base on the adhesive and the second metal pattern after etching the metal base and before etching the adhesive.

21. The method of claim 20, including removing the first metal pattern after forming the insulative base.

22. The method of claim 21, wherein removing the first metal pattern includes applying a wet chemical etchant, and the insulative base protects the second metal pattern from the wet chemical etchant.

23. The method of claim 11, wherein the first metal pattern is disposed within a periphery of the chip and does not overlap the pad, the second metal pattern is disposed within the periphery of the chip and overlaps the pad, and etching the metal base includes removing all of the metal base within a periphery of the pad without removing a portion of the metal base within the periphery of the chip.

24. The method of claim 11, wherein the first metal pattern is disposed outside a periphery of the chip, the second metal pattern extends within and outside the periphery of the chip and overlaps the pad, and etching the metal base includes removing all of the metal base within the periphery of the chip without removing a portion of the metal base outside the periphery of the chip.

25. The method of claim 11, wherein the adhesive is sandwiched between the second metal pattern and the pad, and the connection joint contacts a surface of the second metal pattern that overlaps and faces away from the pad.

26. The method of claim 11, wherein the adhesive is sandwiched between the second metal pattern and the pad, and the connection joint contacts opposing outer edges of the second metal pattern that overlap and are orthogonal to the pad.

27. The method of claim 11, wherein the connection joint is the only electrical conductor external to the chip that contacts the pad.

28. The method of claim 11, wherein the connection joint and the adhesive are the only materials external to the chip that contact the pad.

29. The method of claim 11, wherein the connection joint and the adhesive are the only materials that contact both the second metal pattern and the pad.

30. The method of claim 11, wherein the assembly is devoid of wire bonds, TAB leads and solder joints.

31. A method of making a semiconductor chip assembly, comprising the following steps in the sequence set forth:
providing a metal base with first and second opposing surfaces;
depositing first and second metal patterns on the metal base, wherein the first metal pattern is deposited on the first surface of the metal base, and the second metal pattern is deposited on the second surface of the metal base;
disposing an insulative adhesive between a chip and the second metal pattern, thereby mechanically attaching the chip to the second metal pattern, wherein the chip includes a pad, the metal base is disposed on a side of the second metal pattern opposite the chip, the first metal pattern is disposed outside a periphery of the chip, and the second metal pattern extends within and outside the periphery of the chip and overlaps the pad;
forming an encapsulant that contacts the second surface of the metal base outside the periphery of the chip;
applying an etch to the metal base that is selective of the metal base with respect to portions of the first and second metal patterns that contact the metal base using the first metal pattern as an etch mask, thereby exposing the second metal pattern;
applying an etch to the adhesive, thereby exposing the pad; and
forming a connection joint that electrically connects the second metal pattern and the pad.

32. The method of claim 31, wherein depositing the first and second metal patterns includes forming first and second photoresist layers on the metal base that selectively expose the first and second surfaces of the metal base and then electroplating the first and second metal patterns on the exposed portions of the first and second surfaces.

33. The method of claim 31, wherein depositing the first and second metal patterns includes simultaneously electroplating the first and second metal patterns on the metal base.

34. The method of claim 31, wherein disposing the adhesive includes contacting the adhesive to the chip and the second metal pattern and then hardening the adhesive.

35. The method of claim 31, wherein forming the encapsulant includes transfer molding the encapsulant.

36. The method of claim 31, wherein forming the encapsulant includes curing the encapsulant.

37. The method of claim 31, wherein the encapsulant is compressible and exhibits elastic deformation in response to external pressure.

38. The method of claim 31, including forming an insulative base on the second metal pattern and the adhesive after applying the etch to the metal base and before applying the etch to the adhesive.

39. The method of claim 31, wherein applying the etch to the adhesive includes applying a laser etch that ablates the adhesive.

40. The method of claim 31, wherein applying the etch to the adhesive includes applying a blanket plasma etch.

41. The method of claim 31, wherein forming the connection joint includes electroplating a metal on the second metal pattern and the pad.

42. The method of claim 31, wherein forming the connection includes electrolessly plating a metal on the second metal pattern and the pad.

43. The method of claim 31, wherein forming the connection joint includes applying thermocompression or thermosonic wire bonding using a capillary that presses a wire ball against the second metal pattern and the pad to form a ball bond that contacts and bonds to the second metal pattern and the pad.

44. The method of claim 31, wherein the connection joint contacts a surface of the second metal pattern that overlaps and faces away from the pad.

45. The method of claim 44, wherein the connection joint is the only electrical conductor external to the chip that contacts the pad.

46. The method of claim 44, wherein the connection joint and the adhesive are the only materials external to the chip that contact the pad.

47. The method of claim 44, wherein the connection joint and the adhesive are the only materials that contact both the second metal pattern and the pad.

48. The method of claim 44, wherein the adhesive is sandwiched between the second metal pattern and the pad after applying the etch to the adhesive.

49. The method of claim 31, wherein the first metal pattern includes first and second metal layers, the first metal layer contacts the metal base, the second metal layer contacts the first metal layer and is separated from the metal base by the first metal layer, the second metal layer and the metal base are similar metallic materials, and the first metal layer and the metal base are different metallic materials.

50. The method of claim 31, wherein the chip includes a plurality of conductive pads, a plurality of second metal patterns overlap the pads, the metal base covers the second metal patterns before applying the etch to the metal base, and the second metal patterns are exposed., by applying the etch to the metal base.

51. A method of making a semiconductor chip assembly, comprising:

providing a metal base with first and second opposing surfaces;

providing a first plating mask on the first surface of the metal base, wherein the first plating mask includes an opening that exposes a portion of the first surface;

electroplating a first metal pattern on the exposed portion of the first surface through the opening in the first plating mask, wherein the first metal pattern includes a first metal layer and a second metal layer, the first metal layer contacts the metal base and has a different composition than the metal base, and the second metal layer is separated from the metal base;

removing the first plating mask, thereby exposing outer edges of the first metal pattern;

providing a second plating mask on the second surface of the metal base, wherein the second plating mask includes an opening that exposes a portion of the second surface;

electroplating a second metal pattern on the exposed portion of the second surface through the opening in the second plating mask, wherein the second metal pattern includes a third metal layer and a fourth metal layer, the third metal layer contacts the metal base and has a different composition than the metal base, and the fourth metal layer is separated from the metal base;

removing the second plating mask, thereby exposing outer edges of the second metal pattern; then mechanically attaching a chip to the second metal pattern using an insulative adhesive, wherein the chip includes a pad, the first surface faces away from the chip, the second surface faces towards the chip, the first metal pattern is disposed outside a periphery of the chip, and the second metal pattern extends within and outside the periphery of the chip and overlaps the pad;

forming an encapsulant that contacts the second surface of the metal base outside the periphery of the chip;

applying an etch that is selective of the metal base with respect to the first and second metal layers using the first metal pattern as an etch mask, thereby removing a portion of the metal base within the periphery of the chip without removing a portion of the metal base outside the periphery of the chip, forming a pillar in the metal base outside the periphery of the chip and exposing the second metal pattern;

applying an etch that is selective of the adhesive with respect to the second metal pattern and the pad, thereby removing a portion of the adhesive and exposing the pad; and forming a connection joint that contacts and electrically connects the second metal pattern and the pad.

52. The method of claim 51, wherein the first and second plating masks are photoresist.

53. The method of claim 51, wherein the metal base and the third and fourth metal layers are copper, and the first and second metal layers are nickel.

54. The method of claim 51, wherein the encapsulant is a molded compound.

55. The method of claim 51, wherein applying the etch that is selective of the metal base includes applying a wet chemical etch that is highly selective of copper with respect to nickel.

56. The method of claim 51, wherein applying the etch that is selective of the adhesive includes applying a laser that ablates the adhesive.

57. The method of claim 51, wherein forming the connection joint includes plating a metal on the second metal pattern and the pad.

58. The method of claim 51, wherein the connection joint contacts a surface of the second metal pattern that overlaps and faces away from the pad, the connection joint is the only electrical conductor external to the chip that contacts the pad, the connection joint and the adhesive are the only materials external to the chip that contact the pad, the connection joint and the adhesive are the only materials that contact both the second metal pattern and the pad, and the adhesive is sandwiched between the second metal pattern and the pad.

59. The method of claim 51, including:

etching the metal base using the second metal pattern as an etch mask, thereby forming an undercut channel in the metal base that exposes a portion of the third metal layer that faces away from the chip and towards the second surface of the metal base; and then filling the adhesive into the undercut channel, thereby contacting the adhesive to the portion of the third metal layer.

60. The method of claim 51, including:

etching the metal base using the second metal pattern as an etch mask, thereby forming an undercut channel in the metal base that exposes a portion of the third metal layer that faces away from the chip and towards the second surface of the metal base; and then filling the encapsulant into the undercut channel, thereby contacting the encapsulant to the portion of the third metal layer.

61. A method of making a semiconductor chip assembly, comprising the following steps in the sequence set forth:

providing a metallic structure that includes a metal base and a metal pattern, wherein the metal base includes first and second surfaces that are opposite one another, and the metal pattern is disposed on the second surface;

etching the metal base using the metal pattern as an etch mask, thereby forming an undercut channel in the metal base that is overlapped by the metal pattern and exposes a portion of the metal pattern that faces towards the second surface;

attaching a semiconductor chip to the metallic structure using an insulative adhesive, wherein the chip includes a conductive pad, the first surface faces away from the chip, the second surface faces towards the chip, and the adhesive extends into the channel and contacts the portion of the metal pattern that faces towards the second surface, thereby enhancing the mechanical attachment between the metal pattern and the adhesive;

etching the metal base, thereby exposing the metal pattern;

etching the adhesive, thereby exposing the pad; and forming a connection joint that electrically connects the metal pattern and the pad.

62. The method of claim 61, wherein the metal pattern includes a first metal layer that includes the portion of the metal pattern and contacts the metal base and has a different composition than the metal base, and etching the metal base using the metal pattern as an etch mask includes applying a wet chemical etch that is selective of the metal base with respect to the first metal layer.

63. The method of claim 62, wherein the metal pattern includes a second metal layer that is separated from the metal base and has the same composition as the metal base, and the wet chemical etch removes some but not all of the second metal layer.

64. The method of claim 63, wherein the wet chemical etch removes about a predetermined thickness from exposed portions of the metal base and the second metal layer, thereby forming the channel with an undercut that laterally extends by about the predetermined thickness and reducing a height of the metal pattern by about the predetermined thickness.

65. The method of claim 63, wherein the first metal layer is substantially thinner than the second metal layer after applying the wet chemical etch.

66. The method of claim 63, wherein the metal pattern consists of the first and second metal layers, the metal base and the second metal layer are copper and the first metal layer is nickel.

67. The method of claim 61, wherein the adhesive contacts the pad, a surface of the metal pattern that faces towards the pad, and opposing outer edges of the metal pattern that are orthogonal to the pad.

68. The method of claim 61, wherein the channel traverses substantially all of a length of the metal pattern.

69. The method of claim 61, wherein the adhesive is a thermosetting epoxy.

70. The method of claim 61, wherein the adhesive is a thermoplastic polyimide.

71. A method of making a semiconductor chip assembly, comprising the following steps in the sequence set forth:

providing a metallic structure that includes a metal base and a metal pattern, wherein the metal base includes first and second surfaces that are opposite one another, and the metal pattern is disposed on the second surface;

etching the metal pattern, thereby forming an undercut channel in the metal pattern that exposes a portion of the metal pattern that faces towards the second surface;

attaching a semiconductor chip to the metallic structure using an insulative adhesive, wherein the chip includes a conductive pad, the first surface faces away from the chip, the second surface faces towards the chip, and the adhesive extends into the channel and contacts the portion of the metal pattern that faces towards the second surface, thereby enhancing the mechanical attachment between the metal pattern and the adhesive;

etching the metal base, thereby exposing the metal pattern;

etching the adhesive, thereby exposing the pad; and forming a connection joint that electrically connects the metal pattern and the pad.

72. The method of claim 71, wherein the metal pattern includes a first metal layer and a second metal layer, the first metal layer includes the portion of the metal pattern and has a different composition than the second metal layer, and etching the metal pattern includes applying a wet chemical etch that is selective of second metal layer with respect to the first metal layer that forms the channel in the second metal layer using the first metal layer as an etch mask.

73. The method of claim 72, wherein the metal pattern includes a third metal layer that contacts the metal base, the third metal layer has a different composition than the second metal layer, and the first and second metal layers are separated from the metal base.

74. The method of claim 73, wherein the wet chemical etch forms a second undercut channel in the metal base that is overlapped by the metal pattern and exposes a second portion of the metal pattern at the third metal layer that faces towards the second surface, and the adhesive extends into the second channel and contacts the second portion of the metal pattern.

75. The method of claim 74, wherein the first and third metal layers are each substantially thinner than the second metal layer after applying the wet chemical etch.

76. The method of claim 74, wherein the metal pattern consists of the first, second and third metal layers, the metal base and the second metal layer are copper, and the first and third metal layers are nickel.

77. The method of claim 71, wherein the adhesive contacts the pad, a surface of the metal pattern that faces towards the pad, and opposing outer edges of the metal pattern that are orthogonal to the pad.

78. The method of claim 71, wherein the channel traverses substantially all of a length of the metal pattern.

79. The method of claim 71, wherein the adhesive is a thermosetting epoxy.

80. The method of claim 71, wherein the adhesive is a thermoplastic polyimide.

81. A method of making a semiconductor chip assembly, comprising the following steps in the sequence set forth:

providing a metallic structure that includes a metal base and a metal pattern, wherein the metal base includes first and second surfaces that are opposite one another, and the metal pattern is disposed on the second surface;

attaching a semiconductor chip to the metallic structure using an insulative adhesive, wherein the chip includes a conductive pad, the first surface faces away from the chip, and the second surface faces towards the chip;

etching the metal base using the metal pattern as an etch mask, thereby forming an undercut channel in the metal base that is outside a periphery of the chip and overlapped by the metal pattern and exposes a portion of the metal pattern that faces towards the second surface;

forming an encapsulant that extends into the channel and contacts the portion of the metal pattern that faces towards the second surface, thereby enhancing the mechanical attachment between the metal pattern and the encapsulant;

etching the metal base, thereby exposing the metal pattern;

etching the adhesive, thereby exposing the pad; and forming a connection joint that electrically connects the metal pattern and the pad.

82. The method of claim 81, wherein the metal pattern includes a first metal layer that includes the portion of the metal pattern and contacts the metal base and has a different composition than the metal base, and etching the metal base using the metal pattern as an etch mask includes applying a wet chemical etch that is selective of metal base with respect to the first metal layer.

83. The method of claim 82, wherein the metal pattern includes a second metal layer that is separated from the metal base and has the same composition as the metal base, and the wet chemical etch removes all of the second metal layer.

84. The method of claim 83, wherein the wet chemical etch removes about a predetermined thickness from an exposed portion of the metal base, thereby forming the channel with an undercut that laterally extends by about the predetermined thickness and reducing a height of the metal pattern by a thickness of the second metal layer.

85. The method of claim 83, wherein the first metal layer is substantially thinner than the second metal layer before applying the wet chemical etch.

86. The method of claim 83, wherein the metal pattern consists of the first and second metal layers before applying the wet chemical etch, the metal base and the second metal layer are copper and the first metal layer is nickel.

87. The method of claim 81, wherein the encapsulant contacts the chip.

88. The method of claim 81, wherein the encapsulant does not contact the chip.

89. The method of claim 81, wherein the encapsulant is a molded compound.

90. The method of claim 81, wherein the encapsulant is a cured epoxy.

91. A method of making a semiconductor chip assembly, comprising the following steps in the sequence set forth:

providing a metallic structure that includes a metal base and a metal pattern, wherein the metal base includes first and second surfaces that are opposite one another, and the metal pattern is disposed on the second surface;

attaching a semiconductor chip to the metallic structure using an insulative adhesive, wherein the chip includes a conductive pad, the first surface faces away from the chip, and the second surface faces towards the chip;

etching the metal pattern, thereby forming an undercut channel in the metal pattern that is outside a periphery of the chip and exposes a portion of the metal pattern that faces towards the second surface;

forming an encapsulant that extends into the channel and contacts the portion of the metal pattern that faces towards the second surface, thereby enhancing the mechanical attachment between the metal pattern and the encapsulant;

etching the metal base, thereby exposing the metal pattern;

etching the adhesive, thereby exposing the pad; and forming a connection joint that electrically connects the metal pattern and the pad.

92. The method of claim 91, wherein the metal pattern includes a first metal layer and a second metal layer, the first metal layer includes the portion of the metal pattern and has a different composition than the second metal layer, and etching the metal pattern includes applying a wet chemical etch that is selective of second metal layer with respect to the first metal layer that forms the channel in the second metal layer using the first metal layer as an etch mask.

93. The method of claim 92, wherein the metal pattern includes a third metal layer that contacts the metal base, the third metal layer has a different composition than the second metal layer, and the first and second metal layers are separated from the metal base.

94. The method of claim 93, wherein the wet chemical etch forms a second undercut channel in the metal base that is overlapped by the metal pattern and exposes a second portion of the metal pattern at the third metal layer that faces towards the second surface, and the encapsulant extends into the second channel and contacts the second portion of the metal pattern.

95. The method of claim 94, wherein the first and third metal layers are each substantially thinner than the second metal layer before applying the wet chemical etch.

96. The method of claim 94, wherein the metal pattern consists of the first, second and third metal layers before applying the wet chemical etch, the metal base and the second metal layer are copper, and the first and third metal layers are nickel.

97. The method of claim 91, wherein the encapsulant contacts the chip.

98. The method of claim 91, wherein the encapsulant does not contact the chip.

99. The method of claim 91, wherein the encapsulant is a molded compound.

100. The method of claim 91, wherein the encapsulant is a cured epoxy.

101. A semiconductor chip assembly, comprising:

a semiconductor chip with a conductive pad;

a conductive trace that includes a first surface, a second surface opposite the first surface and elongated outer edges between the first and second surfaces, wherein the first surface faces away from the chip and the second surface faces towards the chip;

an insulative adhesive that contacts the chip, the first and second surfaces and the outer edges, wherein the insulative adhesive extends completely across the second surface between the outer edges and extends partially but not completely across the first surface between the outer edges; and a connection joint that contacts and electrically connects the conductive trace and the pad.

102. The assembly of claim 101, wherein the adhesive defines a gap that traverses the first surface and is substantially centered between the outer edges.

103. The assembly of claim 102, wherein the gap traverses substantially all of a length of the conductive trace.

104. The assembly of claim 101, wherein the adhesive is a thermosetting epoxy.

105. The assembly of claim 101, wherein the adhesive is a thermoplastic polyimide.

106. The assembly of claim 101, wherein the adhesive is sandwiched between the conductive trace and the pad, and the connection joint contacts a surface of the conductive trace that overlaps and faces away from the pad.

107. The assembly of claim 101, wherein the connection joint is the only electrical conductor external to the chip that contacts the pad.

108. The assembly of claim 101, wherein the connection joint and the adhesive are the only materials external to the chip that contact the pad.

109. The assembly of claim 101, wherein the connection joint and the adhesive are the only materials that contact both the conductive trace and the pad.

110. The assembly of claim 101, wherein the assembly is devoid of wire bonds, TAB leads and solder joints.

111. A semiconductor chip assembly, comprising:

a semiconductor chip with a conductive pad;

a conductive trace that includes a routing line and a pillar, wherein the routing line extends within and outside a periphery of the chip, the pillar is disposed outside the periphery of the chip and extends away from the chip, the routing line includes a first surface that faces away from the chip and a second surface that faces towards the chip, and the pillar includes a first surface that faces away from the chip and a second surface that faces towards the chip and an undercut channel;

a connection joint that contacts and electrically connects the routing line and the pad;

an insulative adhesive that contacts the chip and the second surface of the routing line without contacting the first surface of the pillar; and an encapsulant that extends into the channel, wherein the encapsulant contacts the first surface of the routing line, and the pillar.

112. The assembly of claim 111, wherein the encapsulant contacts the chip.

113. The assembly of claim 111, wherein the encapsulant does not contact the chip.

114. The assembly of claim 111, wherein the encapsulant is a molded compound.

115. The assembly of claim 111, wherein the encapsulant is a cured epoxy.

116. The assembly of claim 111, wherein the adhesive is sandwiched between the conductive trace and the pad, and the connection joint contacts a surface of the conductive trace that overlaps and faces away from the pad.

117. The assembly of claim 111, wherein the connection joint is the only electrical conductor external to the chip that contacts the pad.

118. The assembly of claim 111, wherein the connection joint and the adhesive are the only materials external to the chip that contact the pad.

119. The assembly of claim 111, wherein the connection joint and the adhesive are the only materials that contact both the conductive trace and the pad.

120. The assembly of claim 111, wherein the assembly is devoid of wire bonds, TAB leads and solder joints.

\* \* \* \* \*

UNITED STATES PATENT AND TRADEMARK OFFICE
CERTIFICATE OF CORRECTION

PATENT NO. : 6,576,539 B1
DATED : June 10, 2003
INVENTOR(S) : Charles W.C. Lin

It is certified that error appears in the above-identified patent and that said Letters Patent is hereby corrected as shown below:

Column 25,
Line 31, delete ".,".

Signed and Sealed this

Twenty-ninth Day of July, 2003

JAMES E. ROGAN
*Director of the United States Patent and Trademark Office*